United States Patent
Kim et al.

(10) Patent No.: US 6,344,286 B1
(45) Date of Patent: Feb. 5, 2002

(54) DIACETYLENE-BASED POLYMER CONTAINING LIGHT EMITTING GROUP AND ELECTROLUMINESCENT DEVICE USING THE SAME

(75) Inventors: Chung Yup Kim; Hyun Nam Cho; Dong Young Kim; Young Chul Kim; Jae-Min Hong; Jai Kyeong Kim; Jae-Woong Yu, all of Seoul (KR)

(73) Assignees: Hanwha Chemical Corporation; Korea Institute of Science and Technology, both of Seoul (KR)

( * ) Notice: Subject to any disclaimer, the term of this patent is extended or adjusted under 35 U.S.C. 154(b) by 0 days.

(21) Appl. No.: 09/378,126

(22) Filed: Aug. 19, 1999

(30) Foreign Application Priority Data

Jan. 15, 1999 (KR) ............................................. 99/1056

(51) Int. Cl.$^7$ ............................................. H05B 33/14
(52) U.S. Cl. .................... 428/690; 428/704; 428/917; 313/504; 313/506; 252/301.16; 252/301.35; 257/40; 257/103; 526/280; 526/285
(58) Field of Search ................................ 526/280, 285; 428/690, 917, 704; 313/504, 506; 257/40, 103; 252/301.16, 301.35

(56) References Cited

U.S. PATENT DOCUMENTS 5,876,864 A * 3/1999 Kim et al. .................. 428/690

OTHER PUBLICATIONS

Liyun–Nam Cho, et al., "Synthesis and Characterization of Poly (Diethynylfluorene)", The 4th International Conference on Electronic Materials (The Materials Research Society of Korea) Abstract Book, Cheju, Korea, Aug. 24–27, 1998, D–Tue–07.

* cited by examiner

Primary Examiner—Cynthia H. Kelly
Assistant Examiner—Ling Xu
(74) Attorney, Agent, or Firm—Darby & Darby

(57) ABSTRACT

A diacetylene-based polymer of the following formula (I):

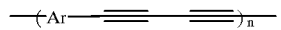

wherein, Ar represents a light emitting group. The present invention also provides an electroluminescence device having a structure of anode/luminescent layer/cathode added with a transfer layer and/or a reflection layer, if necessary, in which the luminescent layer is made of the diacetylene-based polymer containing the light emitting group. The polymer of the present invention can be easily blended with a variety of macromolecules for general use.

11 Claims, 15 Drawing Sheets

DIACETYLENE-BASED POLYMER CONTAINING LIGHT EMITTING GROUP AND ELECTROLUMINESCENT DEVICE USING THE SAME

BACKGROUND OF THE INVENTION

1. Field of the Invention

The present invention relates to fluorene-based alternating polymers to be used as luminescent materials in manufacturing macromolecular electroluminescence (EL) devices, and more particularly relates to EL devices using such fluorene-based alternating polymers as light emitting materials.

2. Description of the Prior Art

Examples of EL elements which have been studied thus far, include inorganic semiconductors such as GaAs which have the advantages of being small in size, require little consumption of electric power, etc., and are currently being used as display devices having a small surface area, light emitting diode (LED) lamps, semiconductor lasers, and the like. However, in manufacturing such elements, extremely clean processing is required, and it is difficult to make LEDs of large surface area and it is difficult to obtain blue light having good efficiency. Furthermore, there are inorganic semiconductors having fluorescent ions of metal compounds added thereto, and inorganic EL elements made by dispersing inorganic semiconductors into high molecule compounds, but these cause problems in semiconductor stability not only because they require a high operating voltage but also because they operate under high electric fields.

However, as organic EL materials (Appl. Phys. Lett., 51, p.913 (1987) and macromolecular EL materials (Nature, 347, p.539(1990)) capable of overcoming such problems have recently been developed, advances in research in these fields are continuing to progress. When voltage is applied to an EL element, which is manufactured by depositing organic dyes (Japanese Laid-open Patent Publication Nos. 6-136360 and 7-26254), or by placing macromolecules having a conjugate double bond (Int'l Patent Publication Nos. WO92/03491, WO93/14177. And WO94/15368) between an anode and a cathode, holes from the cathode and electrons from the anode are introduced into the EL element. The holes and electrons move to a luminescent layer, and are coupled again with each other, thereby emitting light. Currently, efforts are being made to find applications of such EL elements for next generation flat panel color display devices, electrochemical cells, image sensors, photocouplers, and the like which use LEDs, which can replace cathode-ray tubes, gas plasma displays, liquid crystal displays currently being used. However, elements manufactured by deposition of organic dyes have problems in reproducibility and in making uniform films, and although macromolecule-based EL elements have overcome such problems to a certain degree, improved stability, efficiency and durability are still required for desired applications for practical commercial uses.

Poly(phenylene vinylene) (PPV), polythiophene (PTh) and polyphenylene-based macromolecules (Synth. Met. 50(1–3), p.491 (1992) and Adv. Mater., 4, p. 36 (1992)), are known as representative macromolecular luminescent materials which have been currently studied, but these materials have the disadvantage that the final material is insoluble in any organic solvent. Such materials may exhibit an improved processability by appropriate substituents introduced therein. Although PPV and PTh derivatives (Synth. Met., 62, p.35 (1994), Adv. Mater., 4, p.36 (1994), and Macromolecules, 28, p. 7525 (1995)), which emit diverse lights of blue, green and red colors, are known but the manufacturing process of such derivatives is very complicated, and they also exhibit problems in stability. Moreover, fluorene-based macromolecules which emit blue light (Jpn. J. Appl. Phys., 30, p.L1941 (1991)) have been reported but have disadvantages in that they cannot exhibit other various colors, and require the use of a manufacturing method, but by which macromolecules with more diversified conjugate double bonds cannot be made. The inventors of this application disclosed a fluorene-based alternating copolymer for an electroluminescence device having a conjugate double bond, which overcomes the above-described problems, in Korean Patent Application No. 96-16449 filed on May 16, 1996.

Meanwhile, macromolecules containing an acetylene group are disclosed in Makromol Chem. 191, p. 857 (1990), Macromolecules, 27, p 562 (1994), J. Chem. Soc., Chem. Commun., p 1433, (1995) and Macromolecules, 29, p 5157 (1996). However, these materials have been researched for applications for a non-linear optical material, an optical conductivity, and a photoluminescence (hereinafter, referred to as PL) Science, 279, p.835 (1998)). Recently, the present inventors have also proposed macromolecules containing acetylene groups, which are adapted for applications for LEDs, in Korean Patent Application No. 96-82444. Polymers having diacetylene groups have also been proposed (PROG. POLYM. Sci., 20, p.943 (1995), CHEMTECH, October, p.32 (1993) and Macromolecules, 29, p.2885 (1996)). Since such polymers having diacetylene groups are more sensitive to heat or light, cross linking reaction occurs therein easily. Such polymers are mainly applicable to non-linear optical materials, heat resistant macromolecules, polarized PL macromolecules, and electrically and optically active macromolecules. However, there is no application of such polymers to EL materials.

SUMMARY OF THE INVENTION

The present inventors have invented the present invention as a result of their active research to manufacture diverse kinds of macromolecular EL materials which require only a simple manufacturing method while exhibiting a definite structure in the final substance thereof and the materials being well soluble in any organic solvent.

Namely, the present invention is directed to using a polymer containing an acetylene group, as expressed by the following formula (I), to fabricate a macromolecular EL device. Since this polymer has an optical and electrical activity, thereby exhibiting PL characteristics, non-linear optical characteristics, and optical and electrical conductivity, it is expected that the polymer is applicable to photo switches, modules, waveguides, transistors, laser and light absorbers, and macromolecular separating membranes, all of which utilize those characteristics, in addition to applications to EL devices, in particular, LEDs , as mentioned above.

Therefore, an object of the present invention is to provide a light emitting material containing a new light emitting material.

Another object of the present invention is to provide an EL device made of the above mentioned light emitting material.

In accordance with the present invention, these objects are accomplished by providing a diacetylene-based polymer expressed by the following formula (I):

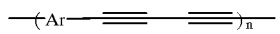

wherein, Ar represents a light emitting group expressed by the following formulas:

Ar =

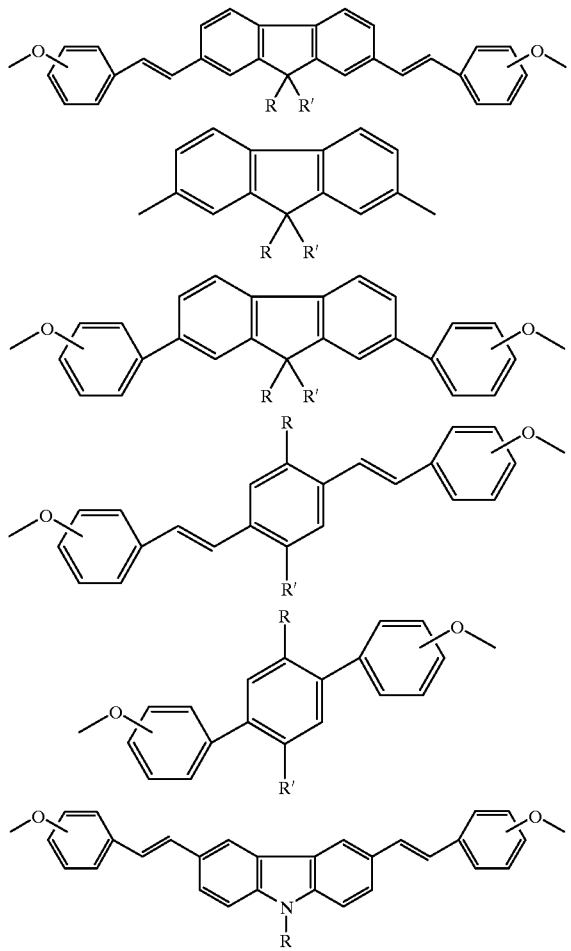

wherein, R and R' are identical or different and are hydrogen, aliphatic or alicyclic alkyl or alkoxy groups containing 1 to 22 carbon atoms, aryl or aryloxy group containing 6 to 18 carbon atoms, or alkyl or aryl derivatives of silicon, tin or germanium; and n represents an integer equal to or greater than 1.

BRIEF ESCRIPTION OF THE DRAWINGS

DESCRIPTION OF THE PREFERRED EMBODIMENTS

Figure 1:
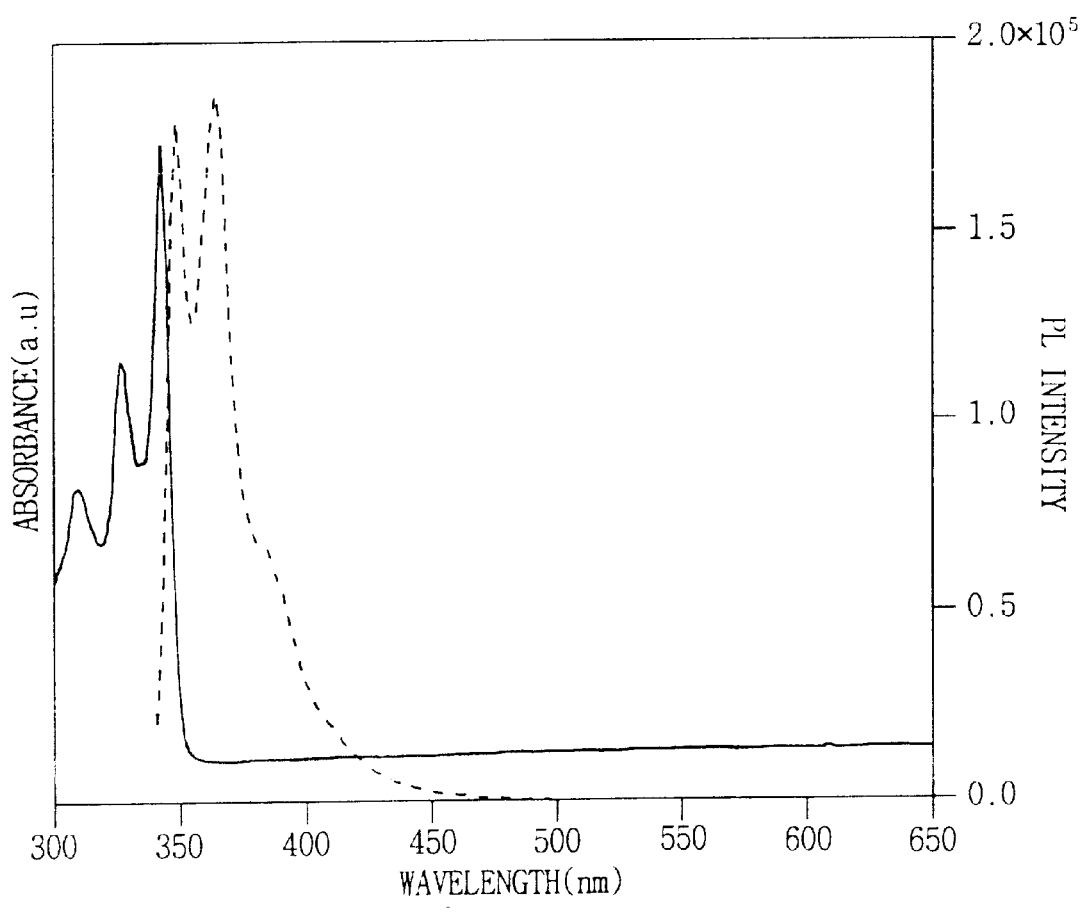
FIG. 1 is a diagram illustrating the UV-visible (UV-Vis) spectrum (__) and photoluminescence (PL) spectrum (-----) of a monomer according to Example 1 of the present invention (a chloroform solution)
Figure 2:
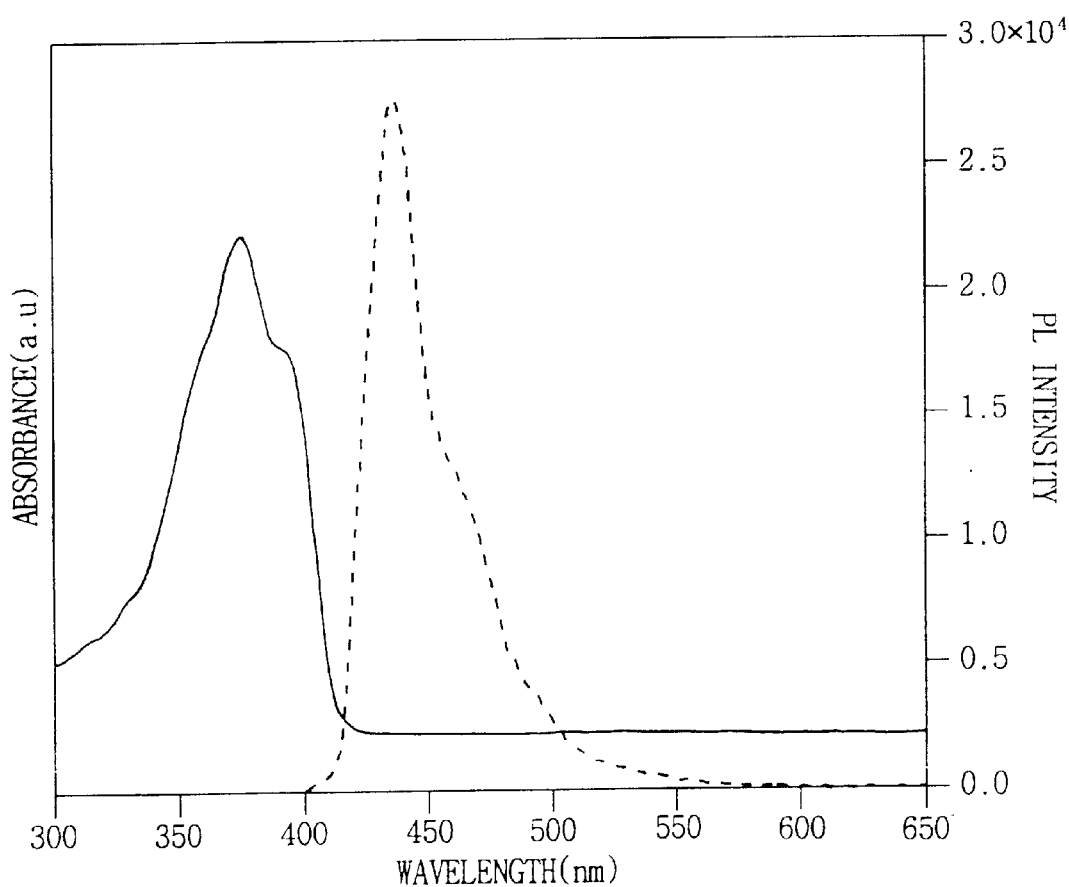
FIG. 2 is a diagram illustrating the UV-Vis spectrum (__) and PL spectrum (-----) of a monomer according to Example 3 of the present invention (a chloroform solution)
Figure 3:
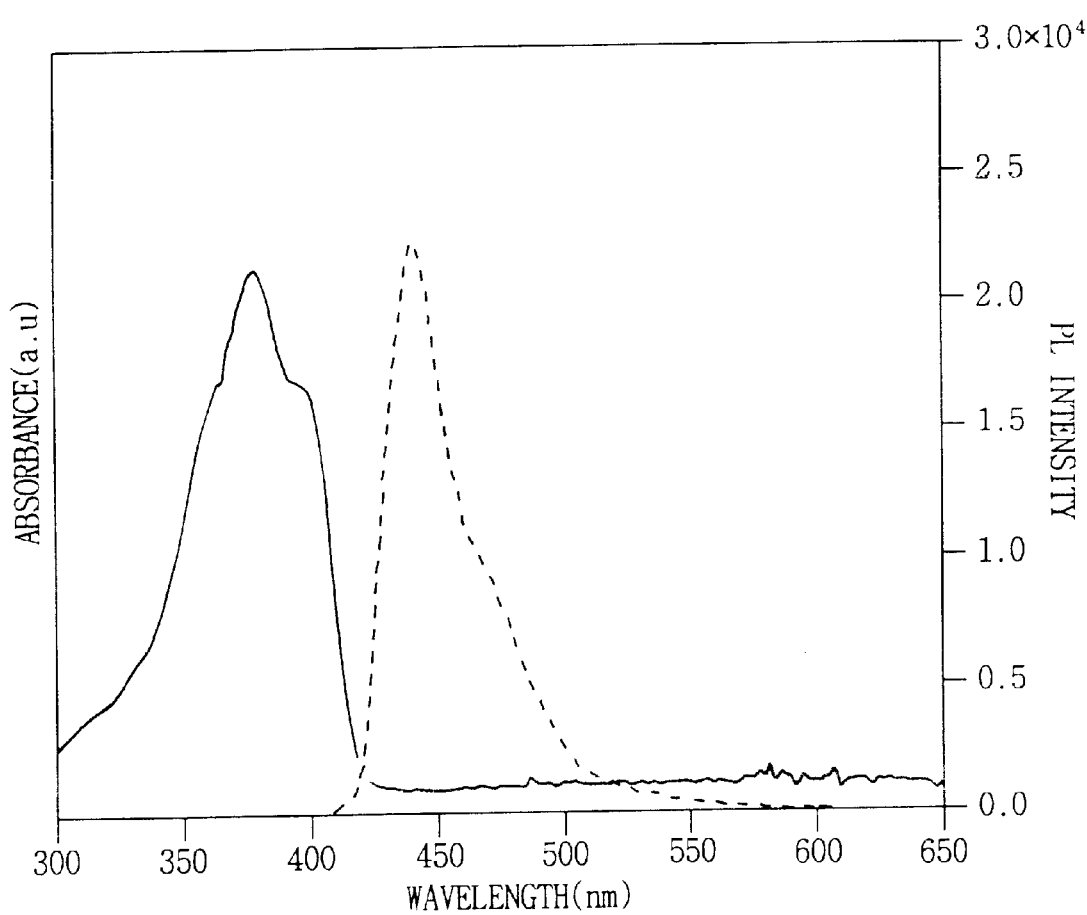
FIG. 3 is a diagram illustrating the UV-Vis spectrum (__) and PL spectrum (-----) of a monomer according to Example 6 of the present invention (a chloroform solution)
Figure 4:
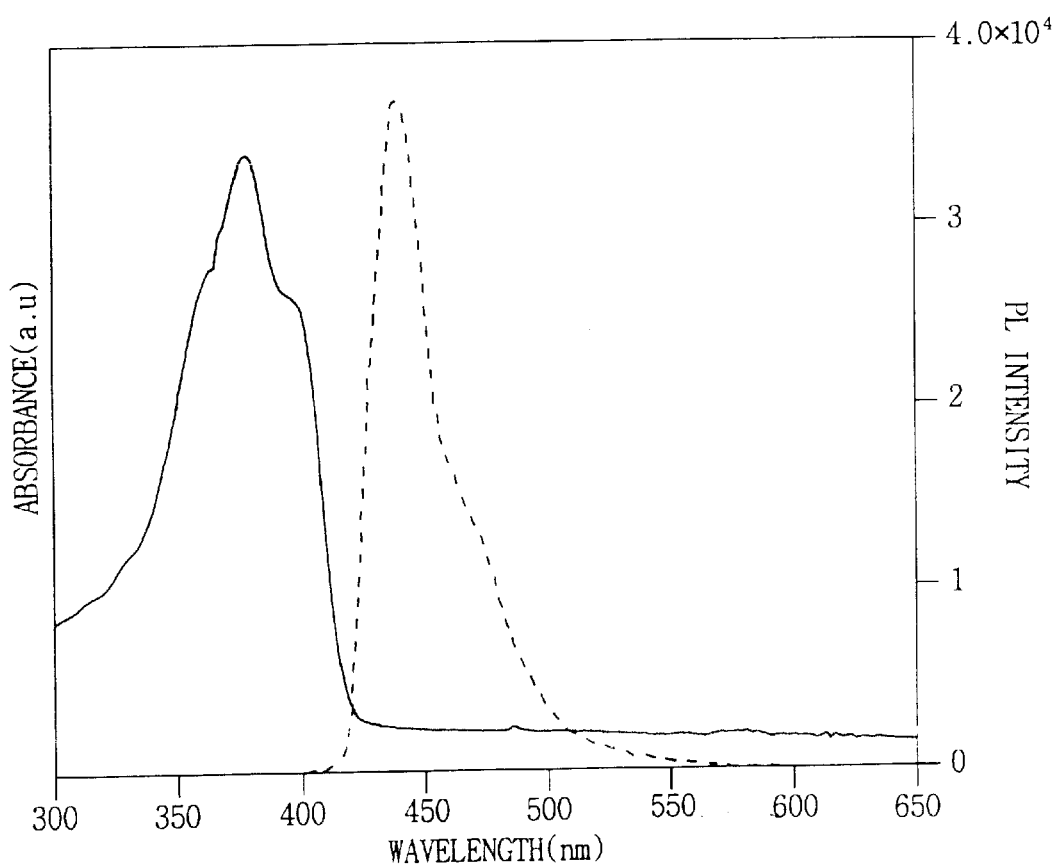
FIG. 4 is a diagram illustrating the UV-Vis spectrum (__) and PL spectrum (-----) of a monomer according to Example 9 of the present invention (a chloroform solution)

The present invention provides a diacetylene-based polymer expressed by the following formula (I):

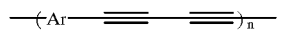

wherein, Ar represents a light emitting group expressed by the following formulas:

Ar =

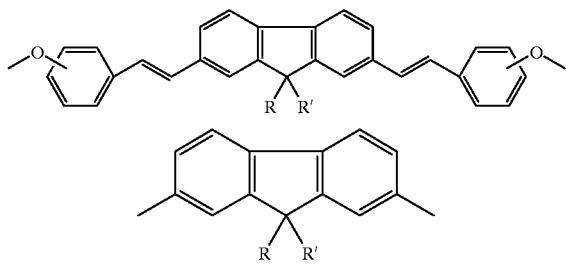

-continued

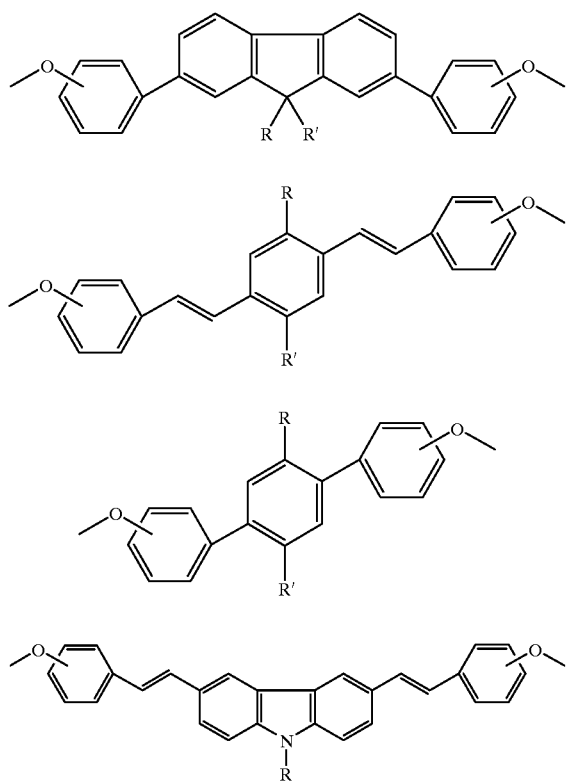

where, R and R' are identical or different, and represent hydrogen, aliphatic or alicyclic alkyl or alkoxy groups containing 1 to 22 carbon atoms, aryl or aryloxy group containing 6 to 18 carbon atoms, or alkyl or aryl derivatives of silicon, tin or germanium; and n represents an integer equal to or greater than 1.

For Ar of the formula (I), any group may be used in so far as it is a light emitting group. Preferably, R and R' include hydrogen, methyl, ethyl, propyl, isopropyl, butyl, isobutyl, pentyl, hexyl, ethylhexyl, heptyl, octyl, isooctyl, nonyl, decyl, dodecyl, hexadecyl, octadecyl, docodecyl, cyclopropyl, cyclopentyl, cyclohexyl, methoxy, ethoxy, butoxy, hexyloxy, methoxyethoxyethyl, methoxyethoxyethoxyethyl, phenyl, phenoxy, tolyl, benzyl, naphthyl, or anthracene groups. R and R' may also include alkyl or aryl derivatives of silicon, tin or germanium such as trimethylsilyl, triphenylsilyl, tributyltin, or triethylgermanium.

The polymerization degree and the manufacturing method of the polymers used in the present invention need not be particularly restricted. For instance, since such polymers are soluble in any organic solvent, the polymerization degree is generally 1 to 2,000, and preferably 3 to 1,000, to the extent that a film is formed by a spin coating or casting method. As a method for preparing a polymer having two triple bonds as represented by Formula (I), a well-known method may be used in which oxygen is introduced into an acetylene compound in the presence of copper chloride, thereby causing it to react with the acetylene compound as expressed by the following reaction scheme (i) (Prog. Polym. Sci., 20., 20, p.943 (1995), Macromolecules, 29, p.2885 (1996)). More specifically, the preparation of the polymer with the acetylene compound can be achieved by carrying out a polymerization of acetylene, using CuCl or Cu(OAc)$_2$, which is a monovalent or divalent copper compound, and pyridine or amine compound such as tetramethylethylenediamine (TMEDA) as a base, in a solvent such as o-dichlorobenzene, chlorobenzene or pyridine, while bubbling oxygen. Reaction Schemes (i) to (iv) show various preparation and polymerization procedures with the acetylene compound, and the structural formulas of the compounds involved. Reaction Schemes (i) to (iv) illustrate exemplified homopolymerizations of a monomer, such as diethynylfluorene(M-2), 2,7-bis(para-propargyloxystyryl)-9,9'-di-N-hexyl fluorene(M-9), 3,6-bis(para-propargyloxystyryl)-di-N-hexyl-carbazole (M-10),1,4-bis(para-propargyloxystyryl)-2,5-di-N-hexyloxybenzene, or the like. Reaction Schemes (v) to (viii) show exemplified copolymerizations of the monomer with other compound(s). In Reaction Schemes (v) to (viii), m has the same definition as n. The synthesis of such monomers, polymers, and copolymers will be apparent by referring to examples which will be made hereinafter.

Reaction Scheme i

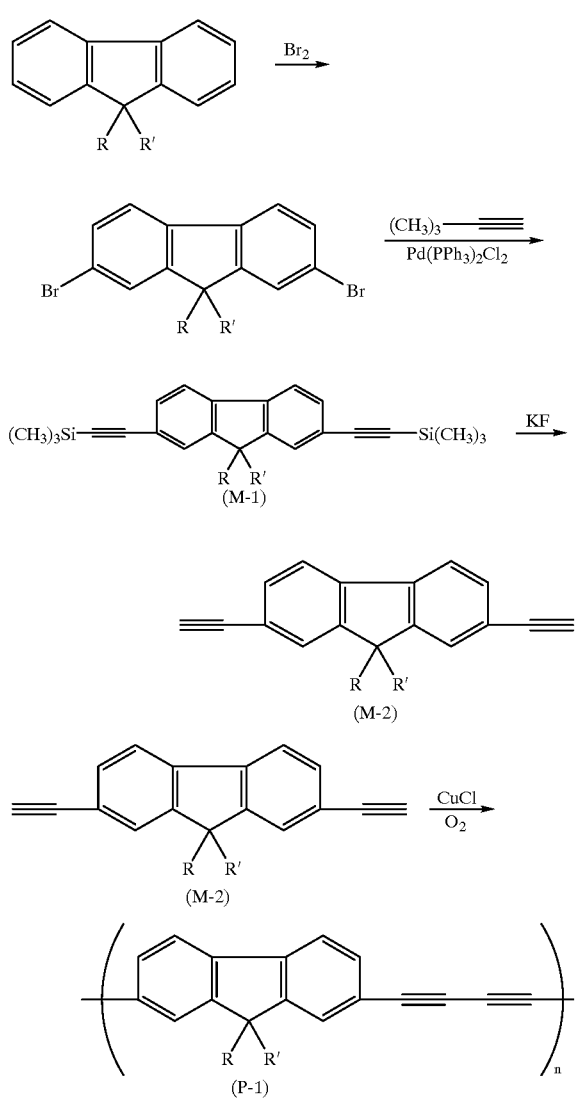

Reaction Scheme ii
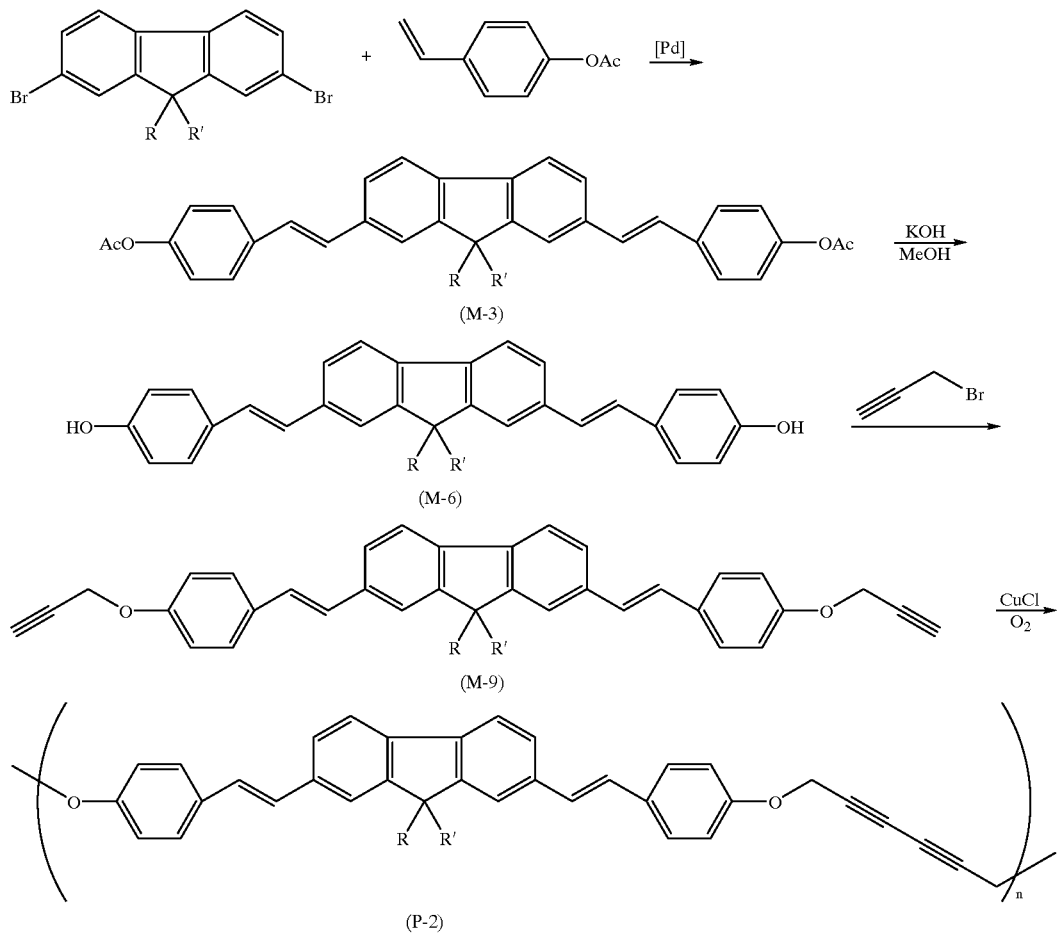
Reaction Scheme iii
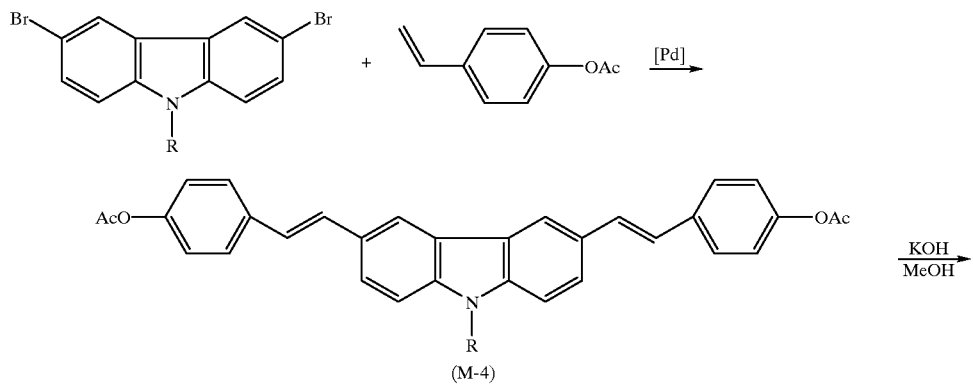

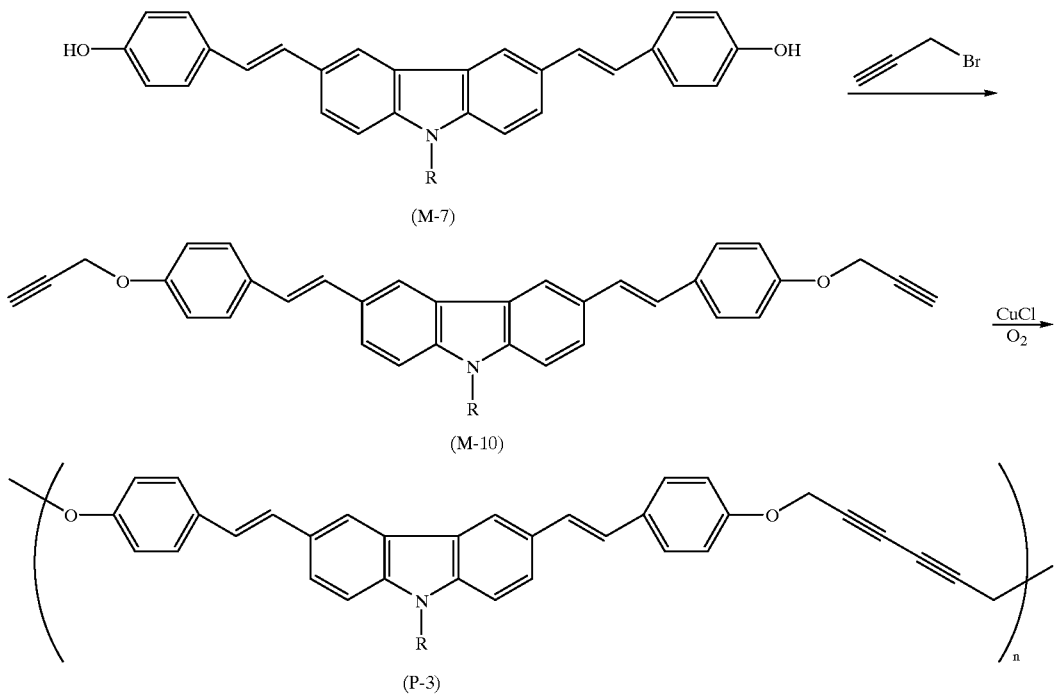
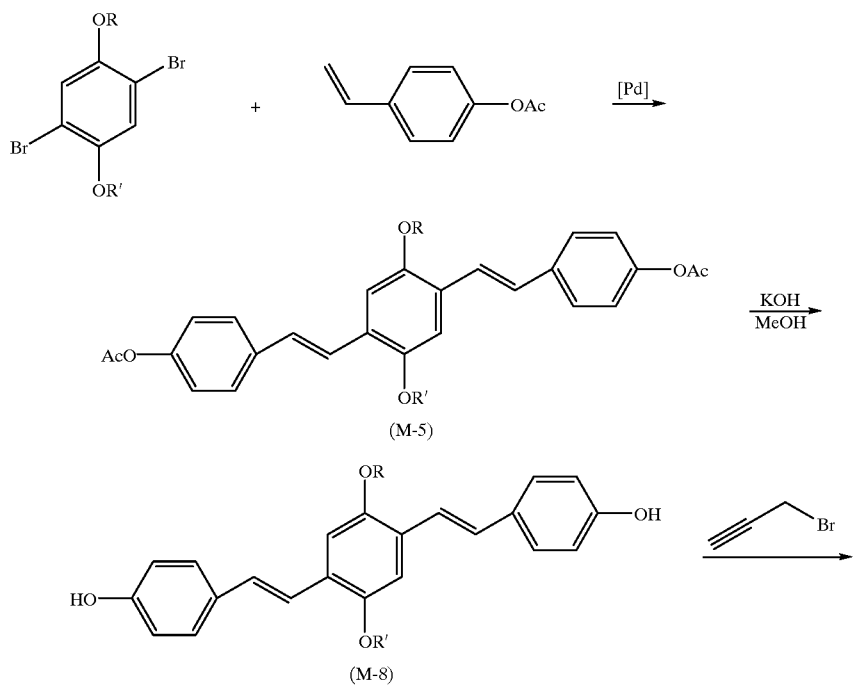
Reaction Scheme iv

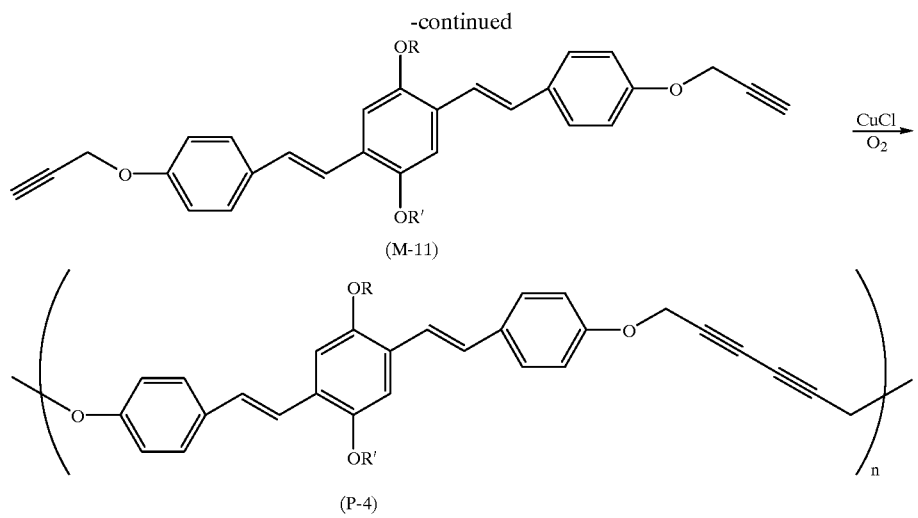
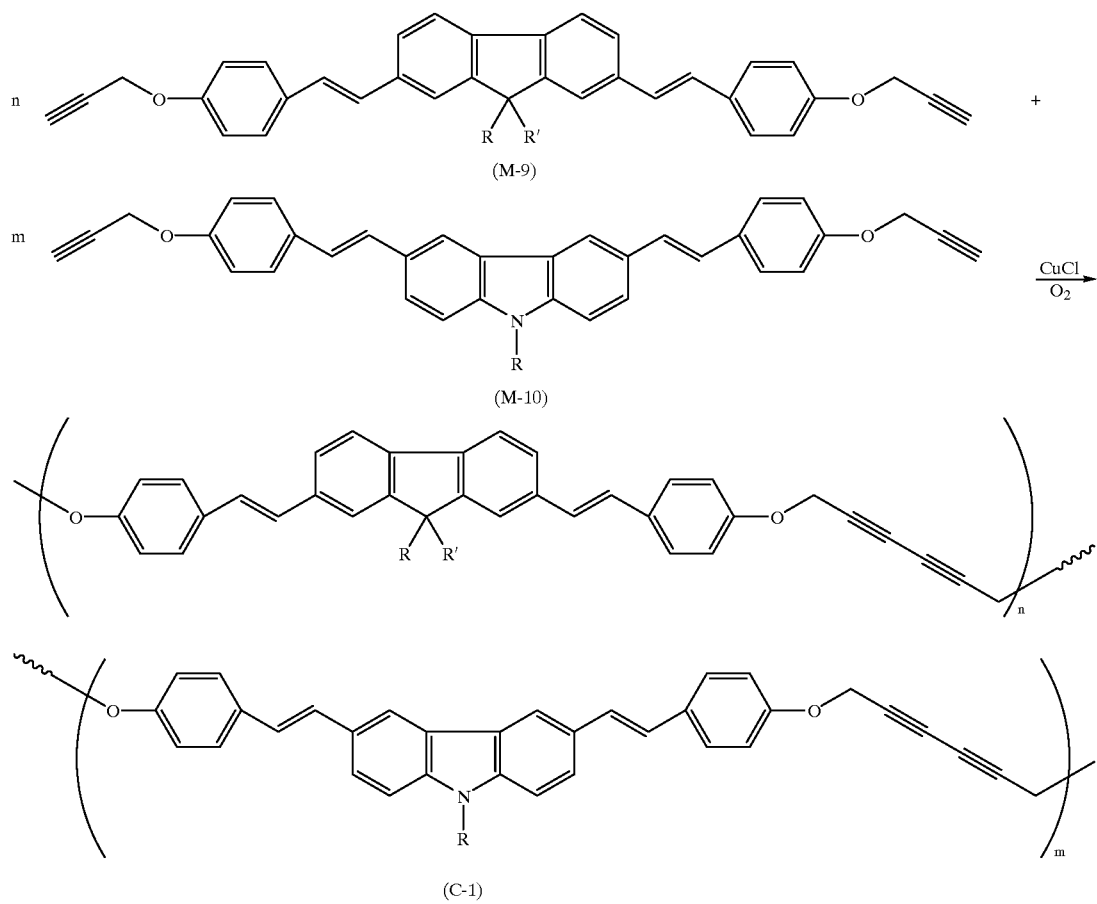

Reaction Scheme vi
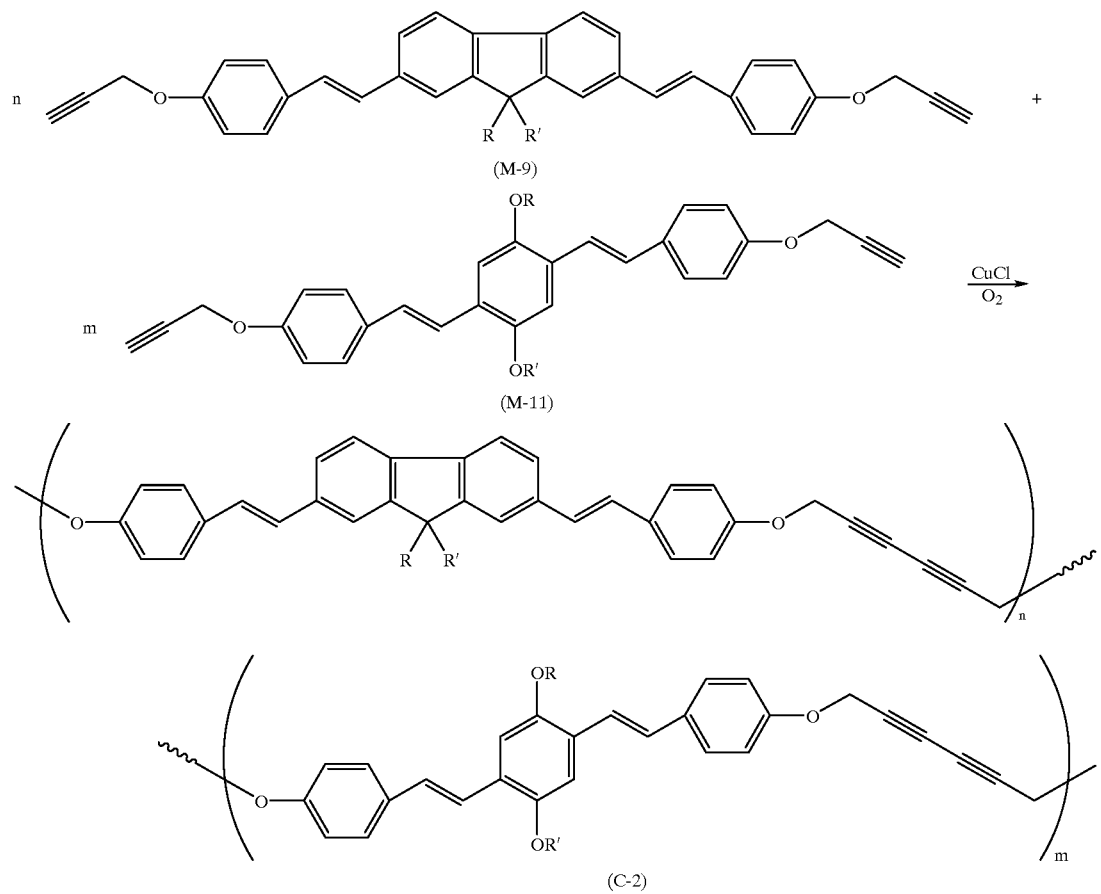
Reaction Scheme vii
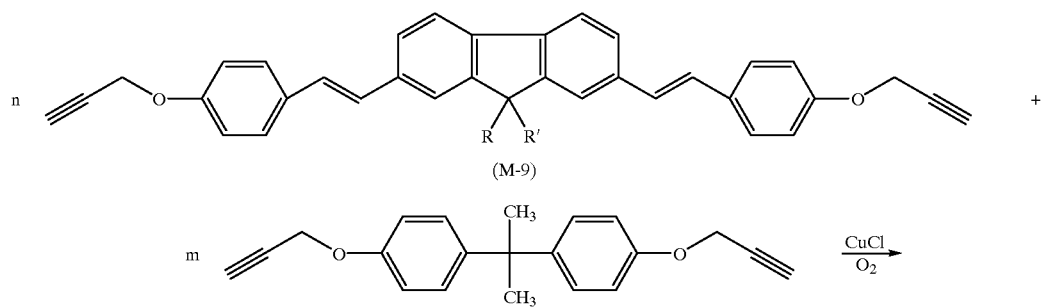

-continued

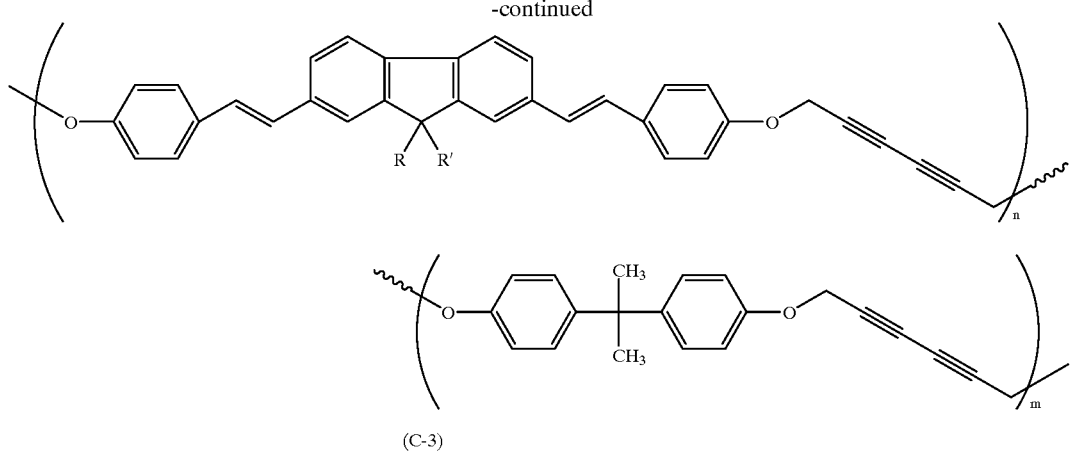

(C-3)

Reaction Scheme viii

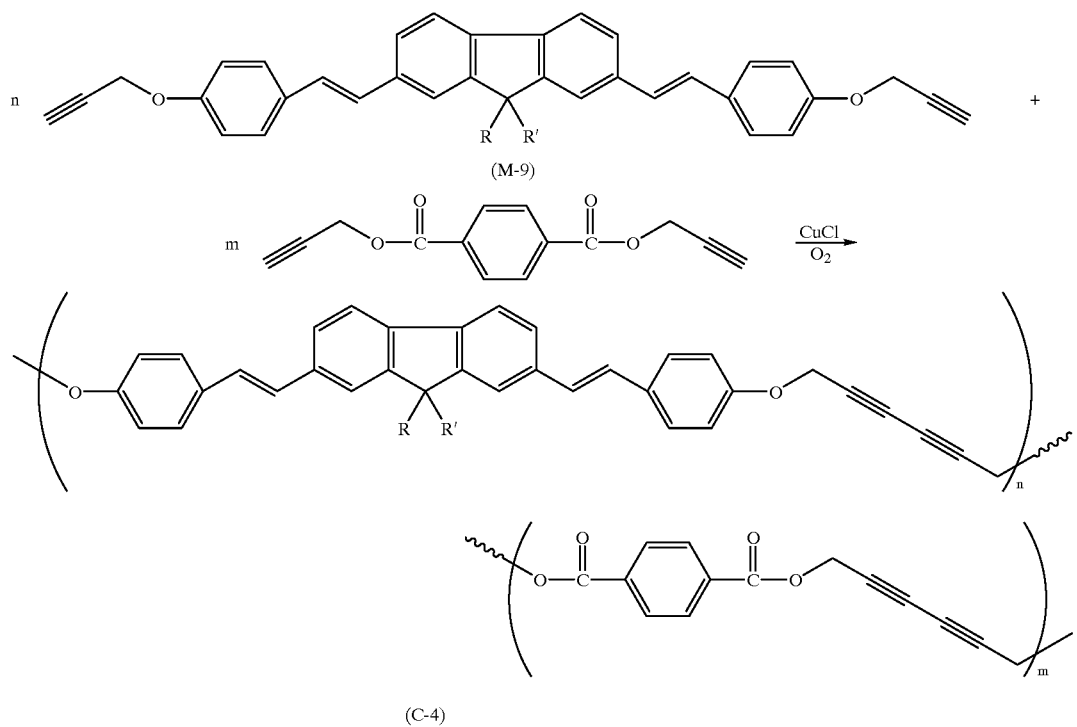

(C-4)

At least one of diacetylene-based copolymers according to the present invention may be polymerized with a variety of known acetylene compounds having the formulas shown below in accordance with a copolymerization or a further interpolymerization to form a copolymer. Such a copolymer is included within the scope of the present invention.

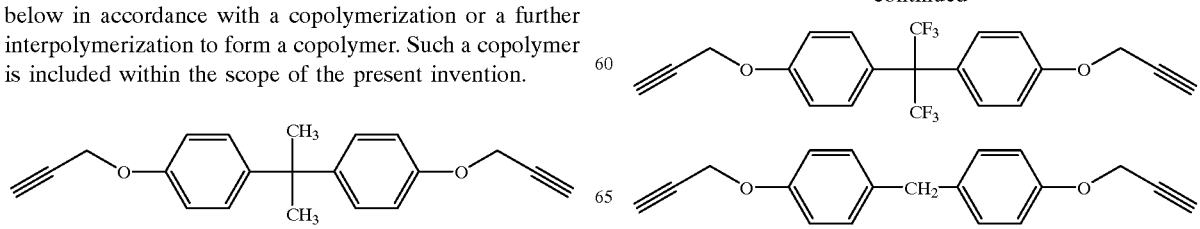

-continued

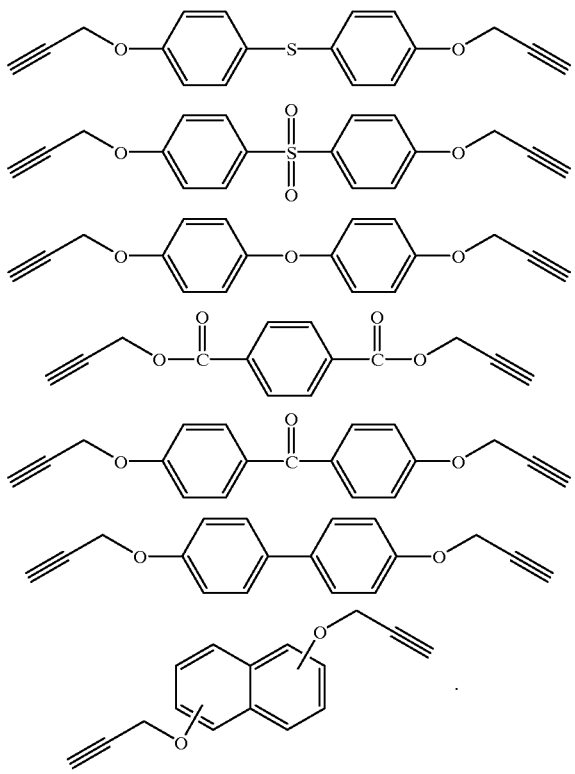

Meanwhile, the luminescent polymer having a diacetylene group in accordance with the present invention may be directly used for a luminescent material. Alternatively, it may be used after being cross-linked by direct heating or by irradiation with light such as ultraviolet rays or electron beams. In the most typical structure of an EL device, to which the present invention is applied, the materials of the present invention, which serves as a luminescent layer, is interposed between an anode and cathode of an EL device. The present invention is not limited to such a structure. For example, the materials of the present invention may also be used along with a hole transfer layer or electron transfer layer, as disclosed in Japanese Patent Publication Nos. 2-135361, 3-152184 and 6-207170. That is, a structure of anode/hole transfer layer/luminescent layer/electron transfer layer/cathode may be implemented. The anode may be comprised of a transparent support substrate made of glass, transparent plastic, or quartz, etc. and coated with a metal or metallic oxide, such as ITO, gold, copper, tin oxide, or zinc oxide, or an organic semiconductor compound such as polypyrrole, polyaniline or polythiophene to a thickness of 10 nanometer to 1 micron. The cathode may be made of metal, such as sodium, magnesium, calcium, aluminum, indium, silver, gold, or copper, or an alloy thereof. Each of the hole transfer layer and electron transfer layer may be formed using a known compound in accordance with which are formed in the form of a thin film in accordance with a known thin film formation method such as a vacuum deposition method, a spin coating method, a casting method, or a LB method. The hole transfer layer may be made of polyvinylcarbazole, 2,5-bis-(4'-diethylaminophenyl)-1,3,4-oxadizole, or N,N'-diphenyl-N,N'-(3-methylphenyl)-1,1'-biphenyl-4,4'-diamine (TPD). The electron transfer layer may be made of tris(8-hydroxyquinolinato) aluminum, 2-(4'-tert-butylphenyl)-5-(4''-bi-phenyl)-1,3,4-oxadiazole or 2,4,7-trinitro-9-fluorenon.

In addition, the luminescent polymers according to the present invention may be blended with the ;material of the hole transfer layer or electron transfer layer, or another known luminescent polymer, different from the polymer of the present invention, such as a soluble PPV or PTh derivative. For example, macromolecules having a diacetylene group according to the present invention are dissolved in an organic solvent, such as chloroform, along with polyvinylcarbazole, poly(1,4-hexyloxy-2,5-phenylenvinylene) or poly(3-hexylthiophene). Using the resultant material, a thin film is formed in accordance with the spin coating method or the casting method. In this case, the luminescent macromolecules of the present invention are used in concentration of 0.001~99 weight % based on the weight of the polyvinylcarbazole, and preferably 0.1~50 weight %. The thin film has a thickness of 5 nanometer to 5 micron, and preferably 50 nanometer to 1 micron. The macromolecules of the present invention may also be blended with macromolecules which are different from the materials of the hole transfer layer or electron transfer layer, but can be dissolved in a general organic solvent, thereby being capable of forming a thin film. In this case, the concentration of the macromolecules of the present invention and the thickness of the thin film are defined within the above ranges, respectively. For example, the macromolecules usable along with the macromolecules of the present invention include thermoplastic resin such as polyvinylcarbazole, polymethylmethacrylate, polyarcylate, polystyrene, polycarbonate, polyvinylchloride, polyethylene, polypropylene, polyacrylonitrile, polyvinylpyrrolidone, polyvinylalcohol, polyvinylacetate, polyvinylbutyral, polyvinylamine, polycaprolacton, polyethylentherephthalate, polybutylentherephthalate, polyurethane, acrylonitrilestyrenebutadiene (ABS), polysulfone, or polyvinylfluoride, etc., or resins for general use, such as acetal, polyamides, polyimides, polyester, alkyd, urea, furan, nylon, melamine, phenol, silicone, or epoxy of the present invention.

The present invention will be hereinafter described in details by examples which are not limitative.

EXAMPLES

Synthesis of Monomers

Monomers to be used in the present invention are not required to be particularly restricted. For example, any monomers may be used as long as the polymer formed after polymerization of those monomers satisfies formula (I). Even though it is not specifically mentioned in the following description, compounds that can be easily synthesized in general, that are already well known or which are similar to the well-known compounds, or commercially available monomers may be synthesized employing well-known methods or similar methods so that the resultant material is used to manufacture the polymer of the present invention. The synthesized material may also be commercially available.

EXAMPLE 1

Synthesis of 2,7-bis[[(trimethylsilyl)ethynyl]-9,9'-di-n-hexylfluorene (M-1)

In a 1 liter three-neck flask equipped with a stirrer, a thermometer and a reflux condenser, 49.2 g (0.1 mol) of 2.7-dibromo-9,9'-di-n-hexylfluorene, 3.95 g (5 mmol) of bis(triphenylphosphine) palladium dichloride [(PPh$_3$)$_2$PdCl$_2$], and 0.95 g (5 mmol) of copper iodide were dissolved in 400 ml of piperidine under nitrogen atmosphere. 21.6 g (0.22 mol) of trimethylsilyl acetylene was then slowly added dropwise into the resultant solution at room temperature. When the addition of the same was finished, a circulation was performed for the solution for three hours while the reaction temperature was slowly increased. When the reaction was finished, the solvent was removed under vacuum condition. The remaining materials were then extracted three times with benzene and then were washed by water several times. Subsequently, the resultant materials were dried using anhydrous magnesium sulfate, and then were decolored using active carbon. Thereafter, the resultant materials were filtered, thus removing the solvent and to obtain a milky solid material. The obtained material was re-crystallized twice using ethanol, thus obtaining pure crystals. The thusly obtained crystals were fully dried in a vacuum oven maintained at a temperature of 30° C. The crystals weighed 42 g with a yield of 80%, and the melting temperature was 126–128° C. $^1$H-NMR(CDCl$_3$), $\delta$0.28(s, 18H, SiCH$_3$), 0.52(br, s 6H, CH$_3$), 0.73–1.12(m, 16H, CH$_2$), 1.89–1.97(m, 4H, CCH$_2$), 7.42–7.61(m, 6H, Aromatic Group). IR (KBr): 2156 cm$^{-1}$(CC), 852 cm$^{-1}$ (SiCH$_3$).

EXAMPLE 2

Synthesis of 2,7-diethynyl-9,9'-di-normal-hexyl fluorene (M-2)

27.4 g (52 mmol) of 2,7-bis[(trimethylsilyl)ethynyl]-9,9'-di-normal-hexyl fluorene 27.4 g and 4.53 g (78 mmol) of potassium fluoride were dissolved in 5 ml of water and 150 ml of dimethyl formamide contained in a 250 ml plask equipped with a mixer and a thermometer, and the resultant solution was reacted at room temperature for 6 hours. When the reaction was finished, the reacted solution was poured into 500 ml of ice water, and then the resultant solution was extracted three times with ethyl ether. The extracted solution was then dried using anhydrous magnesium sulfate. After filtering, the remaining solvent was removed by evaporation to obtain a viscous liquid, which was then refined using silica gel column (a solvent mixture of ethylacetate/hexane= 1/10). The resultant materials were then re-crystallized with ethanol. Thus, soft yellow solid materials of 17.1 g (yield of 86%) were obtained as the title compound, and the melting point thereof was 36 to 37° C. $^1$H-NMR(CDCl$_3$), $\delta$ 0.58(br, 6H, CH$_3$), 0.76–1.13(m, 16H, CH$_2$), 1.93–1.96(m, 4H, CCH$_2$)3.14(s, 2H, CH), 7.46–7.65(m, 6H, Aromatic Group), $^{13}$C-NMR (CDCl$_3$), $\delta$ 14.62, 23.24, 24.39, 30.33, 32.18, 40.94, 55.94, 77.99, 85.26, 120.66, 121.63, 127.29, 131.97, 141.72, 151.80 1R(KBr):3296 cm$^{-1}$ (CH).

EXAMPLE 3

Synthesis of 2,7-bis(para-acetoxystyryl)-9,9'-di-normal-hexylfluorene (M-3)

In a 500 ml three-neck flask equipped with a stirrer, a thermometer and a reflux condenser, 49.2 g (0.1 mol) of 2.7-dibromo-9,9'-di-n-hexylfluorene, 22.2 g(0.22 mol) of triethylamine, 2.24 mg (1.0 mmol) of palladium (II) acetate, and 1.83 g (6.0 mmol) of tri-o-tolylphosphine were dissolved in 200 ml of dimethylformamide (DMF) under nitrogen atmosphere, and then reacted at a temperature of 100° C. for 24 hours. After cooling the resultant solution to room temperature, the resultant solution was added dropwise to 1.5 liter of 2.0 N aqueous hydrochloric acid solution to cause solids to precipitate out. The precipitated solids were filtered, and the filterate was then extracted with water and ethyl ether. The organic layer isolated was dried, and the solvent was removed by evaporation to leave a solid material. Next, the solid was twice recrystallized with ethyl acetate/hexane (1:2) twice, obtaining 46.5 g (yield of 71%) of yellow solid materials as the title compound. The melting point of the obtained materials was 149 to 150° C. $^1$H-NMR (CDCl$_3$), $\delta$ 0.72–1.07(m, 22H, CH$_2$ and CH$_3$), 1.98–2.06 (m-4H, CCH$_2$), 2.31(s, 6H, COCH$_3$), 7.08–7.68(m, 22H, CH$_2$ and CH$_3$), 1.98–2.06(m, 4H, CCH$_2$), 2.31(s, 6H, COCH$_3$), 7.08–7.68(m, 18H, Vinyl and Aromatic), $^{13}$C-NMR (CDCl$_3$), $\delta$13.84, 20.95, 22.43, 23.62, 29.57, 31.33, 40.39, 54.89, 119.95, 120.76, 121.76, 125.67, 126.89, 127.29, 129.55, 135.32, 136.14, 140.68, 149.99, 151.57, 169.38

EXAMPLE 4

Synthesis of 3,6-bis(para-acetoxystyryl)-N-normal-hexyl carbazole (M-4)

In a 500 ml three-neck flask equipped with a stirrer, a thermometer and a reflux condenser, 40.9 g (0.1 mol) of 3,6-dibromo-N-normal-hexyl carbazole, 22,2 g (0,22 mol) of triethylamine, 224 mg (1.0 mmol) of palladium(II) acetate, and 1.83 g (6.0 mmol) of tri-o-tolyphosphine were dissolved in 200 ml of dimethylformamide (DMF), and then reacted at a temperature of 100° C. for 24 hours. The resultant solution, after cooling it to room temperature, the resultant solution was added dropwise to 1.5 liter of 2.0 N aqueous hydrochloric acid solution to cause solids to precipitate out. The precipitated solids were filtered, and the filterate was then extracted with water and ethl acetate. The organic layer isolated was dried, and the solvent was removed by evaporation to leave a solid material. Next, the solid was twice recrystallized with ethyl acetate/hexane (1:2), obtaining 38.3 g (yield of 67%) of a pure solid material as the title compound. The melting point of the obtained material was 149 to 150° C. $^1$H-NMR (CDCl$_3$), $\delta$ 0.86–0.89, 1.22–1.31, 1.82–1.86(m, 11H, CH$_2$ and CH$_3$), 2.31(s, 6H, COCH$_3$), 4.21–4.29(t, 2H, NCH$_2$), 7.08–7.66(m, 16H, Vinyl and Aromatic), 8.22(s, 2H, Aromatic), $^{13}$C-NMR (CDCl$_3$), $\delta$ 13.90, 21.06, 22.44, 26.84, 28.90, 31.47, 43.24, 109.10, 118.71, 121.79, 123.29, 124.72, 125.20, 127.13, 128.66, 129.86, 135.85, 140.72, 149.72, 169.61.

EXAMPLE 5

Synthesis of 1,4-bis(para-acetoxystyryl)-2,5-di-hexyloxy benzene (M-5)

This example was carried out in accordance with the same procedures as those in Example 4, except that 8.7 g (0.02 mol) of 1,4-dibromo-2,5-di-normal-hexyloxy benzene was used instead of 3,6-dibromo-N-hexyl carbazole. The resultant product was recrystallized with hexane to obtain 7.2 g (60% yield) of a yellowish pure solid material. The melting point of the obtained material was 144 to 145° C. $^1$H-NMR (CDCl$_3$), $\delta$ 0.89–0.95, 1.35–1.57, 1.83–1.87(m, 22H, CH$_2$ and CH$_3$), 2.31 (s, 6H, COCH$_3$), 4.01–4.07(t, 4H, OCH$_2$), 7.06–7.51(m, 18H, Vinyl and Aromatic), $^{13}$C-NMR (CDCl$_3$), $\delta$ 13.93, 21.06, 22.56, 25.87, 29.39, 31.56, 69.58, 110.73, 121.76, 123.87, 26.89, 127.43, 127.83, 135.87, 149.99, 151.19, 169.57

EXAMPLE 6

Synthesis of 2,7-bis(para-hydroxystyryl)-9,9'-di-normal-hexyl fluorene (M-6)

In a 500 ml three-neck flask equipped with a stirrer, a thermometer and a reflux condenser, 32.7 g (0.05 mol) of 2,7-bis(para-hydroxystyryl)-9,9'-di-normal-hexyl fluorene and 28.0 g (0.5 mol) of KOH were dissolved in 200 ml of methanol under nitrogen atmosphere, and then reacted while refluxing for 12 hours. The resultant solution, after cooling down to the room temperature, was added dropwise to 2.0 liter of a 2.0 N aqueous hydrochloric acid solution to cause solid to precipitate out. After filtering the precipitated solid, the resultant filterate was washed and then added to toluene. The resultant mixture was distilled to remove water and toluene. The produced solid material was twice ecrystallized with toluene, obtaining 27.1 g (95% yield) of a yellowish pure solid material. The melting point of the obtained material was 96 to 97° C. $^1$H-NMR (CDCl$_3$), δ 0.67–1.16(m, 22H, CH$_2$ and CH$_3$), 1.96–2.04(m, 4H, CCH$_2$), 4.92(s, 2H, OH), 6.82–7.66(m, 18H, Vinyl and Aromatic), $^{13}$C-NMR (CDCl$_3$), δ 13.88, 22.47, 23.67, 29.63, 31.38, 40.45, 54.88, 115.73, 119.89, 120.56, 125.41, 127.37, 127.45, 127.92, 130.68, 136.46, 140.40, 151.56, 155.06

EXAMPLE 7

Synthesis of 3,6-bis(para-hydroxystyryl)-N-normal-hexyl carbazole (M-7)

Using 28.6 g (0.05 mol) of 3,6-bis(para-hydroxystyryl)-N-normal-hexyl carbazole, an experiment was carried out in accordance with the same procedure as described in Example 6, to obtain 23.4 g (96% yield) of a milky solid material having a melting point of 196 to 198° C. $^1$H-NMR (DMSO), δ 0.76–0.85, 1.19–1.24, 1.74–1.77(m, 11H, CH$_2$ and CH$_3$), 4.29–4.37(t, 2H, NCH$_2$), 6.78–7.67(m, 16H, Vinyl and Aromatic), 8.34(s, 2H, Aromatic), 9.49(s, 2H, OH), $^{13}$C-NMR (DMSO), δ 13.42, 21.61, 25.75, 28.20, 30.61, 42.05, 109.26, 115.33, 117.65, 122.28, 124.22, 125.51, 125.88, 127.16, 128.47, 128.58, 139.62, 156.64

EXAMPLE 8

Synthesis of 1,4-bis(para-hydroxystyryl)-2,5-di-n-hexyloxy benzene (M-8)

Using 29.9 g (0.05 mol) of 1,4-bis(para-hydroxystyryl)-2,5-di-n-hexyloxy benzene, an experiment was carried out as in Example 8 to obtain 29.9 g (0.05 mol) of a milky solid material having a melting point of 185 to 187° C. $^1$H-NMR (DMSO), δ 0.87–0.90, 1.30–1.54, 1.75–1.85(m, 22H, CH$_2$ and CH$_3$), 4.02(t, 4H, OCH$_2$), 6.74–6.78, 7.18–7.37(m, 14H, Vinyl and Aromatic), 9.55(s, 2H, OH), $^{13}$C-NMR (DMSO), δ 12.72, 21.04, 24.38, 27.82, 29.96, 67.80, 109.31, 114.63, 118.64, 125.06, 126.56, 127.55, 127.76, 149.33, 156.27

EXAMPLE 9

Synthesis of 2,7-bis(para-propargyloxystyryl)-9,9'-di-n-hexyl fluorene (M-9)

Into a three necked flask equipped with a stirrer, a thermometer and a reflux condenser were charged 11.4 g (0.02 mol) of 2,7-bis(para-propargyloxystyryl)-9,9'-di-n-hexyl fluorene, 8.3 g (0.06) of K$_2$CO$_3$, 7.1 g (0.06 mol) of propargyl bromide, 0.1 g of 18-crown-6 and 100 ml of acetone. Then, the mixture was refluxed. Next, the reaction temperature was lowered to the room temperature, and the solvent was then removed by evaporation. The remaining reaction solution was extracted with water and ether. The organic layer isolated was dried over anhydrous magnesium sulfate, and the solvent was removed by evaporation, thereby obtaining a viscous oil. The oil was purified by a silica gel column chromatography with a mixed solvent of ethyl acetate/hexane (1:5) and then twice recrystallized with the same solvent, thus obtaining 11.0 g (85% yield) of a yellowish pure solid material having a melting point of 91 to 92° C. $^1$H-NMR (CDCl$_3$), δ 0.71–1.13(m, 22H, CH$_2$ and CH$_3$), 1.97–2.05(m, 4H, CCH$_2$), 2.54(s, 2H, CH), 4.72(s, 4H, OCH$_2$), 6.96–7.66(m, 18H, Vinyl and Aromatic), $^{13}$C-NMR (CDCl$_3$), δ 13.90, 22.49, 23.68, 29.66, 31.41, 40.48, 54.89, 55.81, 75.59, 78.50, 115.17, 119.86, 120.57, 125.48, 127.28, 127.65, 127.83, 131.32, 136.46, 140.47, 151.56, 157,19

EXAMPLE 10

Synthesis of 3,6-bis(para-propargyl oxystyryl)-N-normal-hexylcarbazole (M-10)

A procedure described in Example 9 was repeated, except that 9.7 g (0.02 mole) of 3,6-bis(para-propargyl oxystyryl)-N-normal-hexylcarbazole was used instead of 2,7-bis(para-hydroxylstyryl)-9,9'-di-normal-hexyl fluorene. Obtained was a yellowish pure solid material weighed 7.3 g (65% yield) having a melting point of 119 to 120° C. $^1$H-NMR (CDCl$_3$), δ 0.86–0.89, 1.26–1.33, 1.82–1.86(m, 11H, CH$_2$ and CH$_3$), 2.54(s, 2H, CH), 4.22–4.29(t, 2H, NCH$_2$), 4.72(s, 4H, OCH$_2$), 6.97–7.66(m, 16H, Vinyl and Aromatic), 8.22(s, 2H, Aromatic), $^{13}$C-NMR (CDCl$_3$), δ 13.88, 22.41, 26.81, 28.87, 31.45, 43.15, 55.82, 75.51, 78.59, 108.98, 115.16, 118.39, 123.25, 124.47, 125.49, 127.36, 128.05, 128.92, 131.74, 140.47, 156.85

EXAMPLE 11

Synthesis of 1,4-bis(para-propargyloxy styryl)-2,5-di-normal-hexyloxy benzene (M-11)

The procedure in Example 9 was repeated, except that 10.3 g (0.02 mol) of 1,4-bis(para-propargyloxy styryl)-2,5-di-normal-hexyloxy benzene was used instead of 2,7-bis(para-hydroxylstyryl)-normal hexyl fluorene.exyl fluorene. A material obtained was recrystalized with ethyl acetate, thereby obtaining a yellowish pure solid material weighing 10.5 g (89% yield) while having a melting point of 95 to 96° C. $^1$H-NMR (CDCl$_3$), δ 0.89–0.96, 1.25–1.40, 1.83–1.93(m, 22H, CH$_2$ and CH$_3$), 2.54(s, 2H, CH), 4.01–4.07(t, 4H, OCH$_2$), 4.72(s, 4H, OCH$_2$), 6.95–7.50(m, 14H, Vinyl and Aromatic), $^{13}$C-NMR (CDCl$_3$), δ 12.34, 20.96, 24.27, 27.82, 29.96, 54.17, 67.92, 73.94, 76.95, 108.90, 113.50, 120.39, 125.24, 126.08, 126.36, 130.19, 149.44, 155.51

EXAMPLE 12

Polymerization of 2,7-diethynyl-9,9'-di-normal-hexyl fluorene (P-1)

1.52 g (4.0 mmol) of 2,7-diethynyl-9,9'-di-normal-hexyl fluorene, 0.10 g (10.0 mmol) of cuprous chloride, 1.50 g (12.9 mmol) of N,N,N', N'-tetramethylethylenediamine, and 20 ml of chlorobenzene were charged into a 50 ml flask equipped with a stirrer, and the mixture was then reacted for 1 hour under nitrogen atmosphere while bubbling oxygen. The resultant viscous reaction solution was added dropwise to a solution of 10 ml of 2.0 N hydrochloric acid in 1 liter of methanol to cause solids to precipitate out. The precipitated solid was filtered. The resultant filtrate was dissolved in chloroform, and then re-precipitated in methanol to obtain a purified solid. Thereafter, the resultant solid was washed with methanol and then completely dried in a vacuum oven at 40° C., thereby obtaining 1.35 g of a yellowish solid material. This polymer had a mass average molecular weight of 202,200 and a molecular weight distribution of 3.64 when measured with GPC using a polystyrene reference substance in tetrahydrofuran. $^1$H-NMR (CDCl$_3$), δ 0.5–1.2(br, m, CH$_3$ ᖿ CH$_2$), 1.8–2.1(br, s, CCH$_2$), 7.4–7.7(br, m, Aromatic), $^{13}$C-NMR (CDCl$_3$), δ 13.92, 22.52, 23.65, 29.57, 31.42, 40.13, 55.22, 74.57, 83.11, 120.32, 120.73, 126.98, 131.78, 141.34, 151.36

EXAMPLE 13

Polymerization of 2,7-bis(para-propargyloxystyryl)-9,9'-di-normal-hexyl fluorene (P-2)

Using 2.58 g (4.0 mmol) of 2,7-bis(para-propargyloxystyryl)-9,9'-di-normal-hexyl fluorene and 30 ml of o-dichlorobenzene, instead of 2,7-diethynyl-9,9'-di-normal-hexyl fluorene and chlorobenzene, respectively, the polymerization in Example 12 was repeated, thereby obtaining 1.98 g of a yellow solid material. This polymer showed a mass average molecular weight of 119,900 and a molecular weight distribution of 5.23 when measured with GPC using a polystyrene reference substance in tetrahydrofuran, $^1$H-NMR (CDCl$_3$), δ 0.71–1.25(br, m, CH$_3$ and CH$_2$), 2.03 (br, s, CCH$_2$), 4.77(s, OCH$_2$), 6.93–7.62(m, Vinyl and Aromatic)

EXAMPLE 14
Polymerization of 3,6-bis(para-propargyloxystyryl)-N-normal-hexyl carbazole (P-3)

Using 2.25 g (4.0 mmol) of 3,6-bis(para-propagyloxy styryl)-N-normal-hexyl carbazole instead of 2,7-bis(para-propargyloxystyryl)-9,9'-di-normal-hexyl fluorene, polymerization was carried out in accordance with the method described in Example 13, to obtain 1.34 g of a yellow solid material.

The mass average molecular weight and molecular weight distribution of the obtained polymer were 47,500 and 3.56, respectively, when measured with GPC using a polystyrene reference substance in chloroform. 1H-NMR (CDCl$_3$), δ 0.82–1.73(br, m, CH$_3$ and CH$_2$), 4.10(br, s, NCH$_2$), 4.64(br, s, OCH$_2$), 6.87–7.42(br, m, Vinyl and Aromatic), 8.12(br, s, Aromatic)

EXAMPLE 15
Polymerization of 1,4-bis(para-propargyloxystyryl)-2,5-di-normal-hexyloxybenzene (P-4)

Polymerization was carried out in accordance with the method described in Example 13 using 2.36 g (4.0 mmol) of 1,4-bis(para-propargyloxystyryl)-2,5-di-normal-hexyloxybenzene instead of 2,7-bis(para-propargyloxystyryl)-9,9'-di-normal-hexyl fluorene, to obtain 1.85 g of a yellow solid material. A mass average molecular weight and a molecular weight distribution of the obtained polymer were 86,300 and 4.87, respectively, when measured with GPC using a polystyrene reference substance in chloroform. $^1$H-NMR (CDCl$_3$), δ 0.90–1.85(br, m, Ch$_2$ and CH$_3$), 4.02–4.04(br, t, OCH$_2$), 4.76(br, s, OCH$_2$), 6.92–7.48 (br, m, Vinyl and Aromatic).

EXAMPLE 16
Copolymerization of 2,7-bis(para-propargyloxystyryl)-9,9'-di-normal-hexyl fluorene with 3,6-bis(para-propargyloxy styryl)-N-normal-hexyl carbazole (C-1)

In a 50 ml flask equipped with a stirrer, 1.29 g (2.0 mmol) of 2,7-bis(para-propargyloxy styryl)-9,9'-di-normal-hexyl fluorene, 1.13 g (2.0 mmol) of 3,6-bis(para-propargyloxystyryl)-N-normal-hexyl carbazole, 0.10 g (10.0 mmol) of cuprous chloride, and 1.50 g (12.9 mmol) of N,N,N',N'-tetramethylethylenediamine were dissolved in 30 ml of o-dichlorobenzene under nitrogen atmosphere. The resultant solution was then reacted for one hour while bubbling oxygen. The resultant reaction solution was added dropwise to 1 liter of methanol to cause polymers to precipitate out. After filtering the precipitated polymer, the resultant filtrate was dissolved in chloroform and re-precipitated in methanol, thereby obtaining purified solid material. After the solid material was washed well with methanol, it was dried to dryness in a vacuum oven at 40° C., obtaining 1.95 g of a yellow solid material as the polymer. A weight average molecular weight and a molecular weight distribution of the obtained polymer were 94,600 and 6.79, respectively, when measured with GPC using a polystyrene reference substance in tetrahydrofuran. $^1$H-NMR (CDCl$_3$), δ 0.74–1.98(br, m, CH$_3$ and CH$_2$), 4.20(br, s, NCH$_2$) 4.75(br, s, OCH$_2$), 6.92–7.59(br, m, Vinyl and Aromatic), 8.17(br, s, Aromatic)

EXAMPLE 17
Copolymerization of 2,7-bis(para-propargyloxystyryl)-9,9'-di-normal-hexyl fluorene with 1,4-bis(para-propargyloxystyryl)-2,5-di-normal-hexyloxybenzene (C-2)

Copolymerization was carried out in accordance with the same procedure as described in Example 17 using 1.18 g (2.0 mmol) of 1,4-bis(para-propargyloxy styryl)-2,5-di-normal-hexyloxybenzene instead of 3,6-bis(para-propargyloxy styryl)-N-normal-hexyl carbazole, to obtain 2.12 g of a yellow solid material as a desired polymer. The mass average molecular weight and molecular weight distribution of the obtained polymer were 145,000 and 5.01, respectively, when measured with GPC using a polystyrene reference substance in tetrahydrofuran. $^1$H-NMR (CDCl$_3$), δ 0.71–1.99(br, m, CH$_3$ and CH$_2$), 4.03(br, t, OCH$_2$), 4.77(br, s, OCH$_2$), 6.91–7.61(br, m Vinyl and Aromatic)

EXAMPLE 18
Copolymerization of 2,7-bis(para-propargyloxystyryl)-9,9'-di-normal-hexyl fluorene with dipropargyl bisphenol A (C-3)

Copolymerization in Example 16 was repeated, except that 0.61 g (2.0 mmol) of dipropargyl bisphenol A instead of 3,6-bis(para-propargyloxystyryl)-N-normal-hexyl carbazole was used, to obtain 1.45 g of a yellow solid material as a desired polymer. The mass average molecular weight and molecular weight distribution of the obtained polymer were 26,100 and 2.30, respectively, when measured with GPC using a polystyrene reference substance in tetrahydrofuran, $^1$H-NMR (CDCl$_3$), δ 0.71–2.01(br, m, CH$_3$, and CH$_2$), 4.70(br, s, OCH$_2$), 4.77(br, s, OCH$_2$), 6.81–7.51(br, m, Vinyl and Aromatic)

EXAMPLE 19
Copolymerization of 2,7-bis(para-propargyloxystyryl)-9,9'-di-normal-hexyl fluorene with dipropargyl terephtalate (C-4)

Copolymerization was carried out in accordance with the same procedure as described in Example 16 using 0.48 g (2.0 mmol) of dipropargyl terephtalate instead of 3,6-bis (para-propargyloxystyryl)-N-normal-hexyl carbazole was used, to obtain 1.23 g of a yellow solid material as a desired polymer. The weight average molecular weight and molecular weight distribution of the obtained polymer were 36,900 and 2.37, respectively, when measured with GPC using a polystyrene reference substance in tetrahydrofuran. $^1$H-NMR (CDCl$_3$), δ 0.70–2.02(br, m, CH$_3$ and CH$_2$), 4.79(br, s, OCH$_2$), 5.01(br, s, COOCH$_2$), 6.93–7.67(br, m Vinyl and Aromatic), 8.12(br, s, Aromatic)

Figure 5:
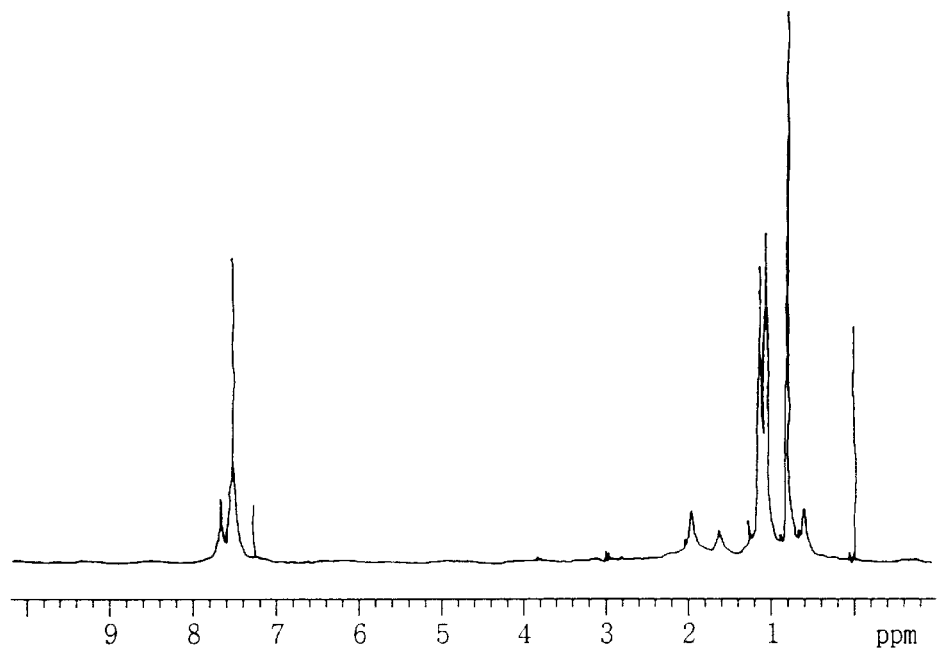
FIG. 5 is a diagram illustrating the $^1$H-NMR spectrum of a polymer according to Example 12 of the present invention.
Figure 6:
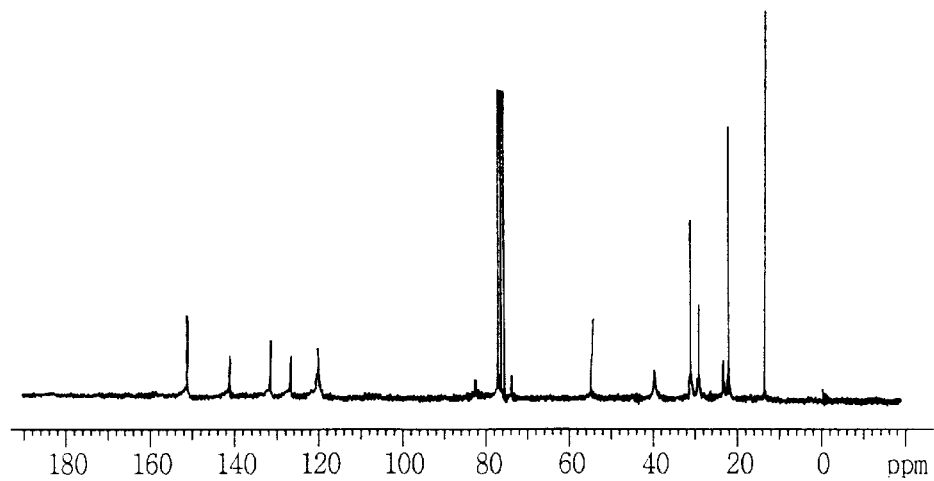
FIG. 6 is a diagram illustrating the $^{13}$C-NMR spectrum of a polymer according to Example 12 of the present invention.
Figure 7:
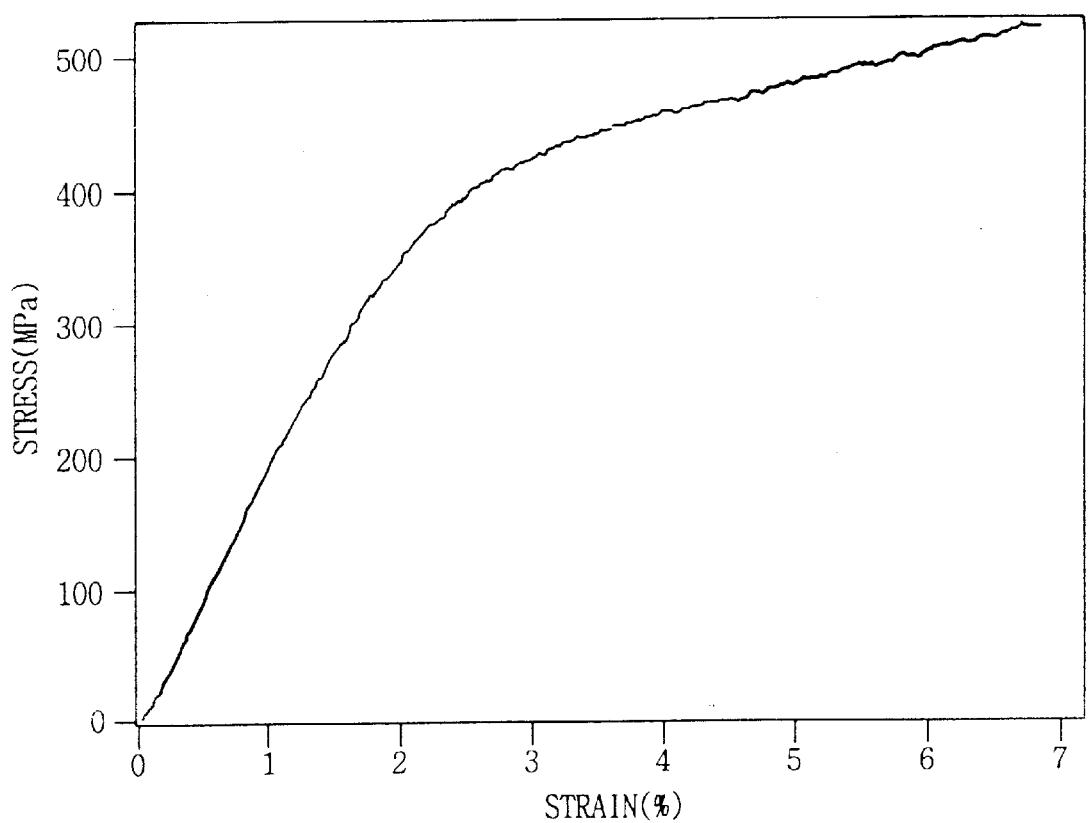
FIG. 7 is a stress-strain curve of a film made of a polymer P-1 according to Example 12 of the present invention.
Figure 8:
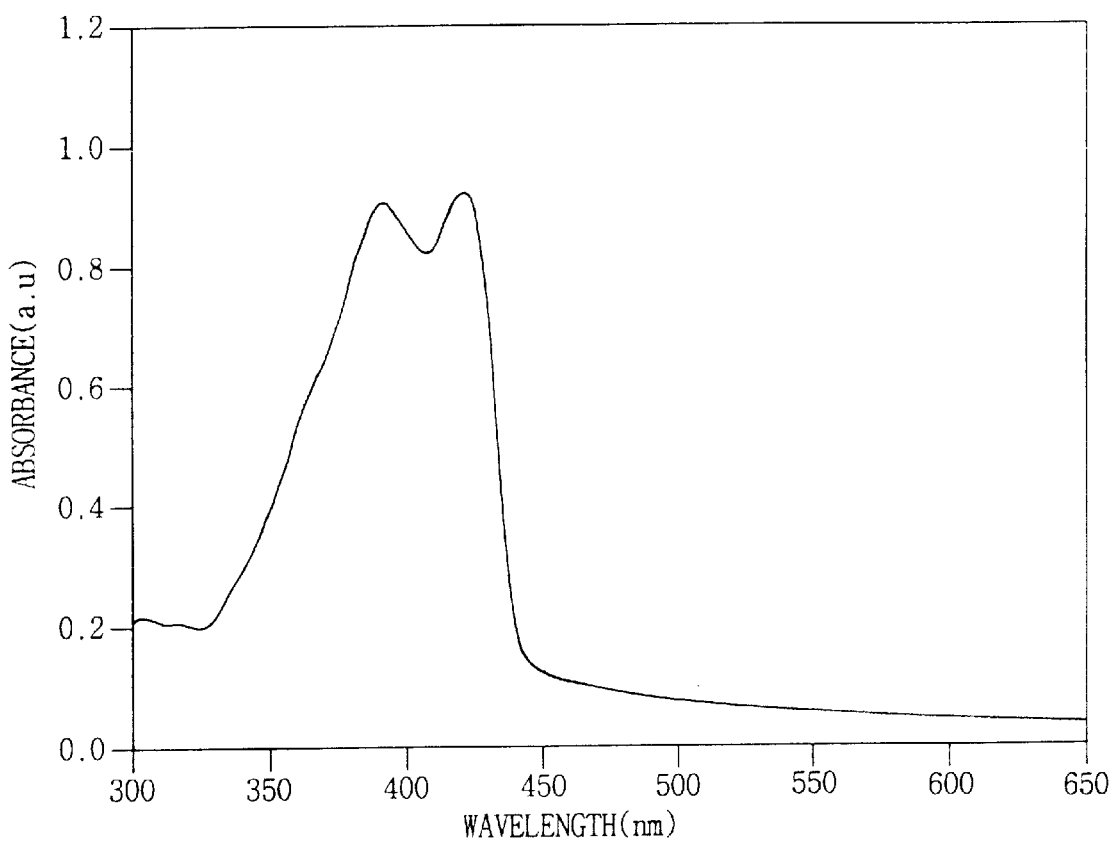
FIG. 8 is a diagram illustrating the Uv-Vis spectrum of the film made of the polymer P-1 according to Example 12 of the present invention.
Figure 9:
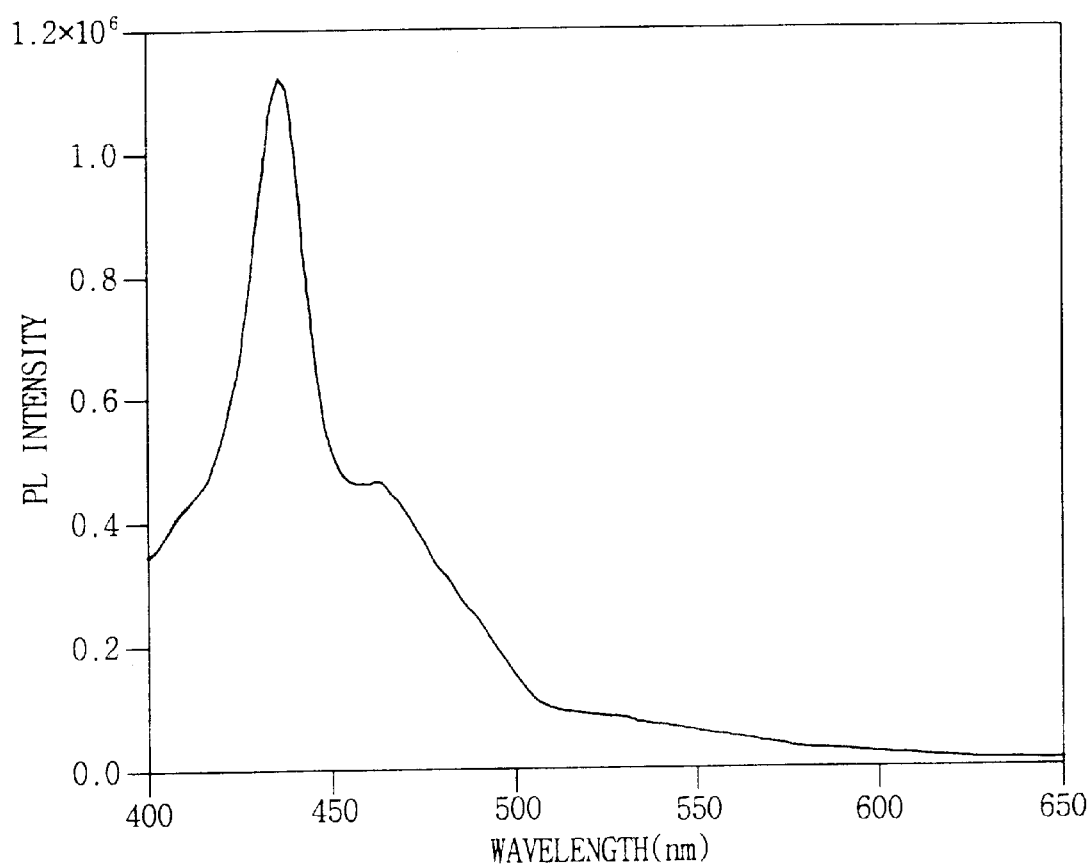
FIG. 9 is a diagram illustrating the PL spectrum of the film made of the polymer P-1 (polyvinylcarbazole/P-1)=8/2) according to Example 12 of the present invention.
Figure 10:
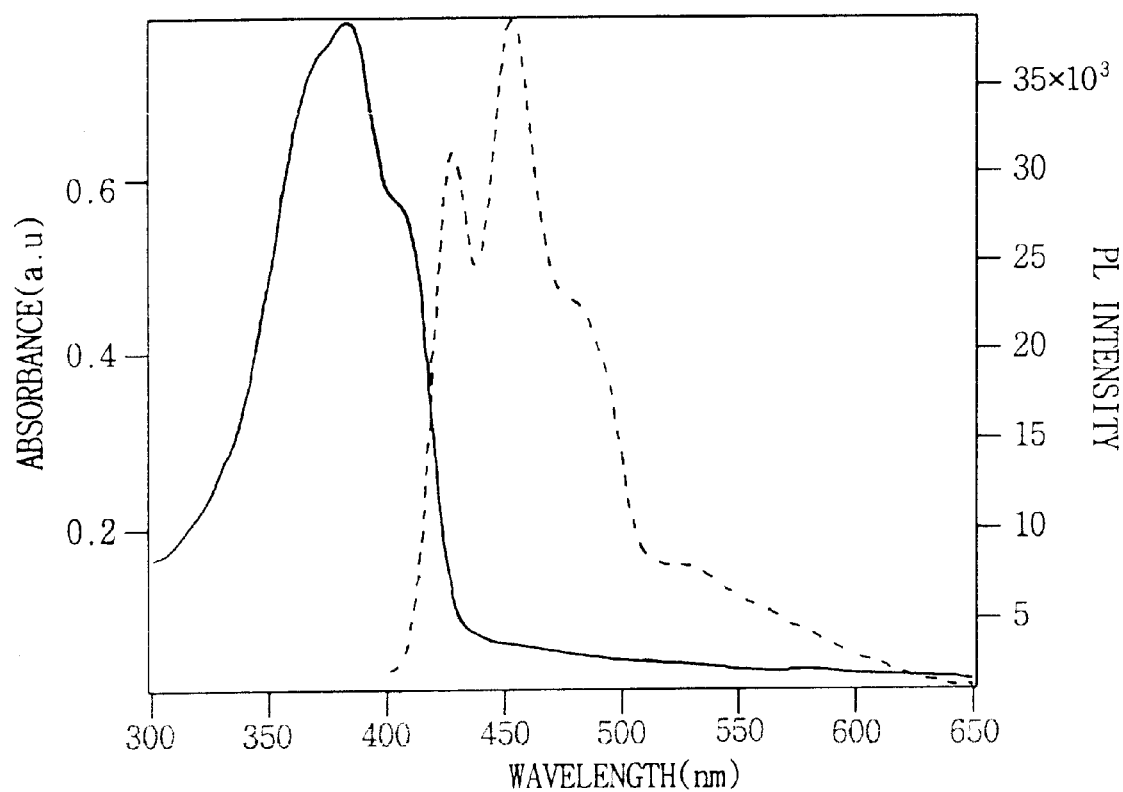
FIG. 10 is a diagram illustrating the UV-Vis spectrum (__) and PL spectrum (-----) of a polymer according to Example 13 of the present invention (a chlorobenzene solution)
Figure 11:
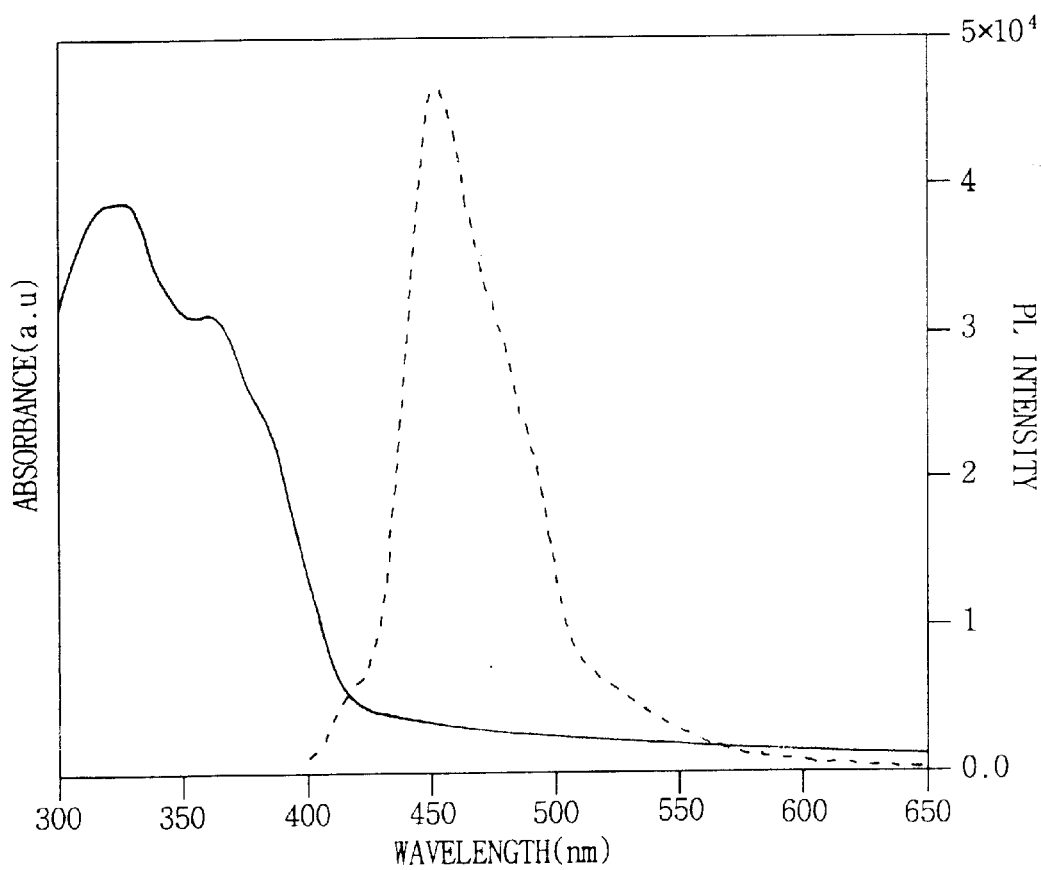
FIG. 11 is a diagram illustrating the UV-Vis spectrum (__) and PL spectrum (-----) of a polymer P-3 according to Example 14 of the present invention.
Figure 12:
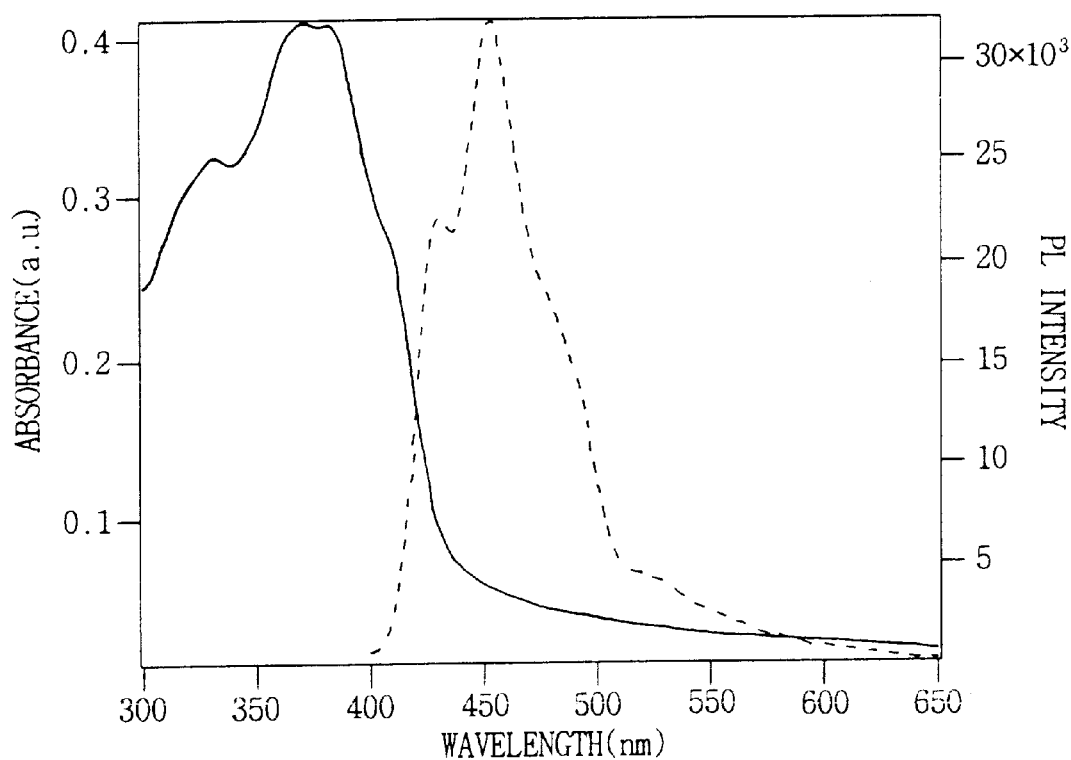
FIG. 12 is a diagram illustrating the UV-Vis spectrum (__) and PL spectrum (-----) of a copolymer C-1 according to Example 16 of the present invention (a chlorobenzene solution)
Figure 13:
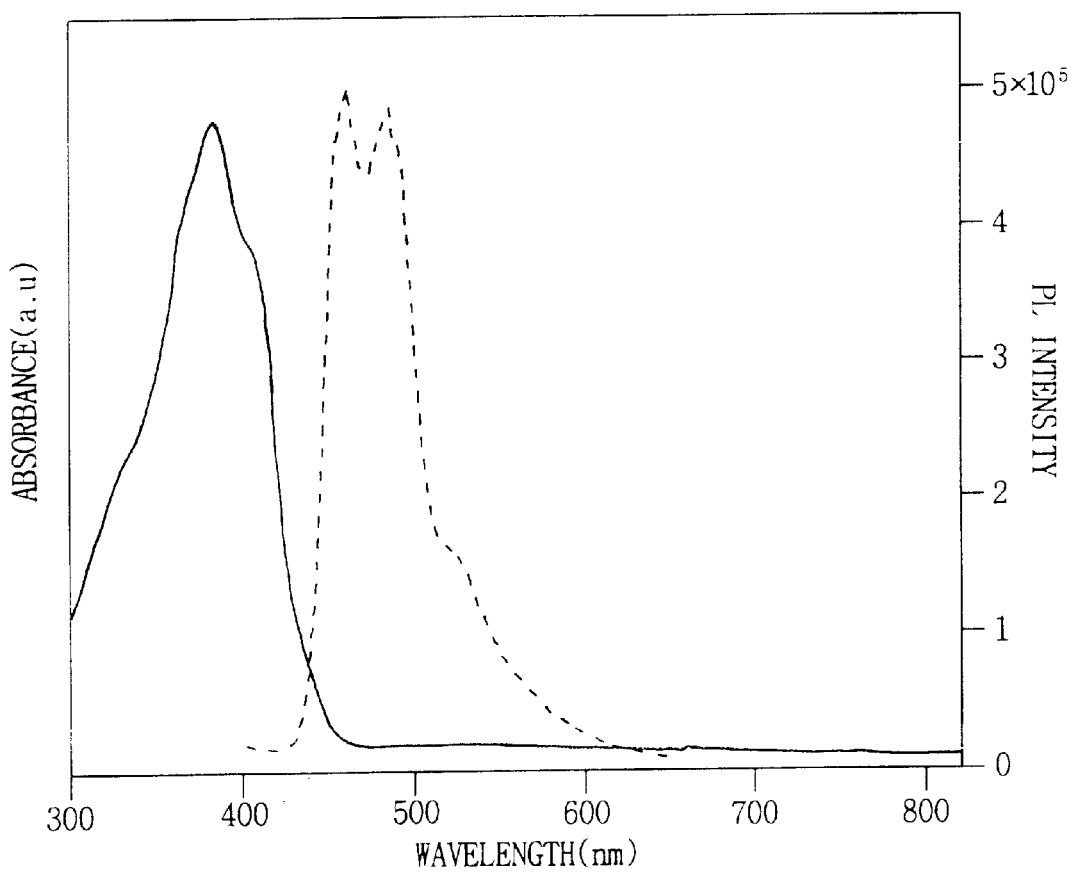
FIG. 13 is a diagram illustrating the UV-Vis spectrum (__) and PL spectrum (-----) of a film made of a polymer C-2 according to Example 17 of the present invention.
Figure 14:
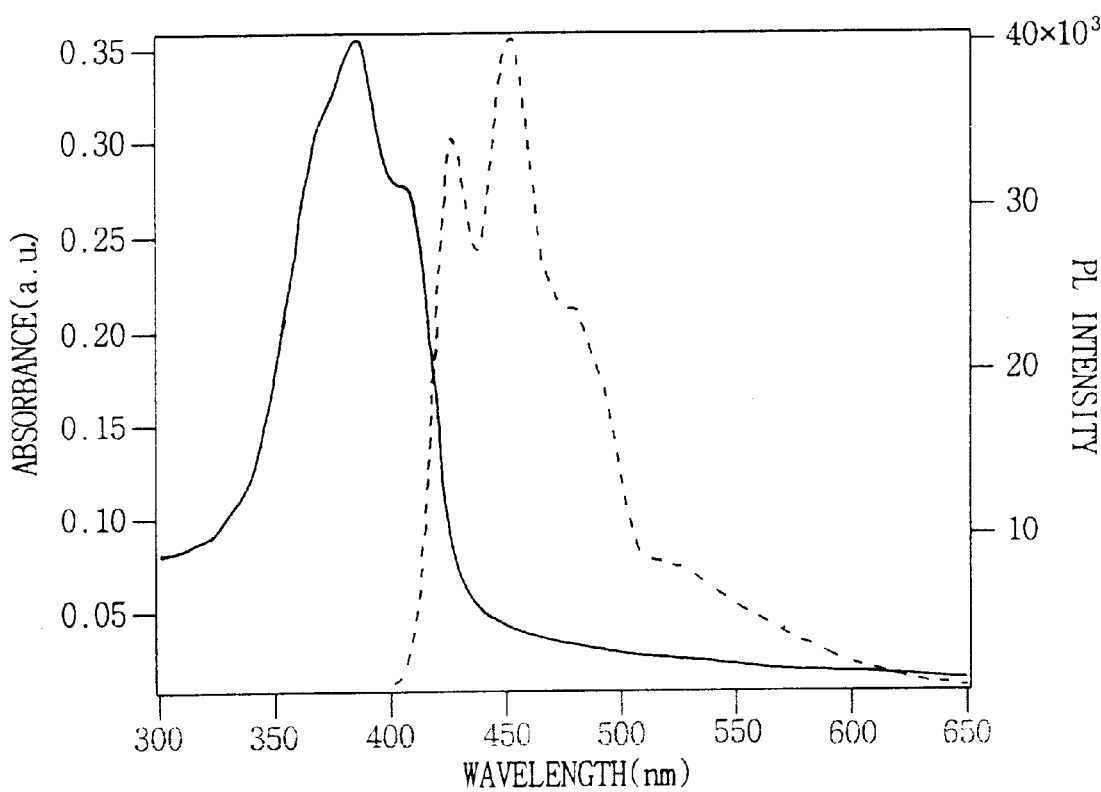
FIG. 14 is a diagram illustrating the UV-Vis spectrum (__) and PL spectrum (-----) of a polymer C-3 according to Example 18 of the present invention (a chlorobenzene solution)
Figure 15:
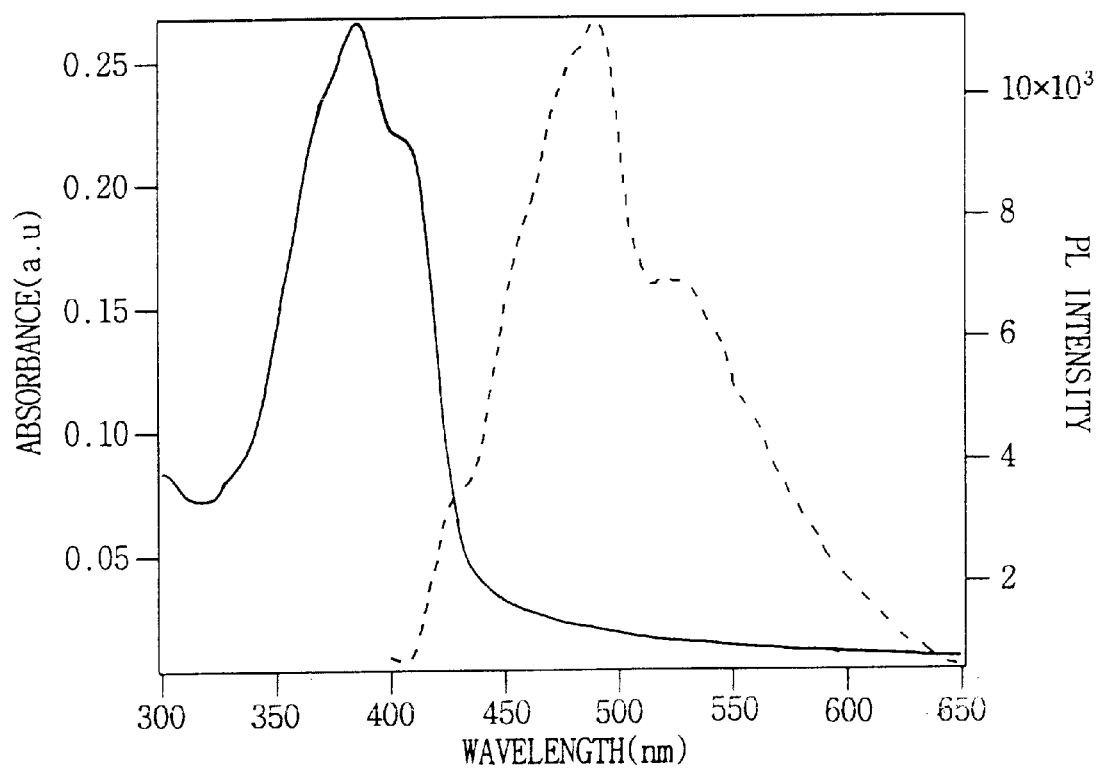
FIG. 15 is a diagram illustrating the UV-Vis spectrum (__) and PL spectrum (-----) of a polymer C-4 according to Example 19 of the present invention (a chlorobenzene solution)

EXAMPLE 20
Structural Analysis, Ultraviolet Ray, Photoluminescence and Electroluminescence Characteristics Ultraviolet-visible (UV-Vis) and photoluminescence (PL) spectra of representative monomers prepared in accordance with the above Examples are shown in FIGS. 1 to 4. Referring to FIG. 5 and 6, $^1$H and $^{13}$C NMR spectra of the polymer prepared in Example 12 are shown. Mechanical properties and UV-Vis and PL spectra of a polymeric thin film was accomplished by dissolving 0.1 g of the polymer or copolymer in 5 ml of chloroform, purifying the resultant solution using a 0.2 micron filter, and then performing a spin coating while controlling the spin speed (usually, 900 to 1,200 rpm) such that a thin film having a thickness of about 100 nm is formed. After being dried at the room temperature, the coated sample was measured for the UV spectrum, and then for the PL spectrum using a wavelength of the maximum UV peak value. Results obtained are shown in FIGS. 10 to 15.

Figure 16:
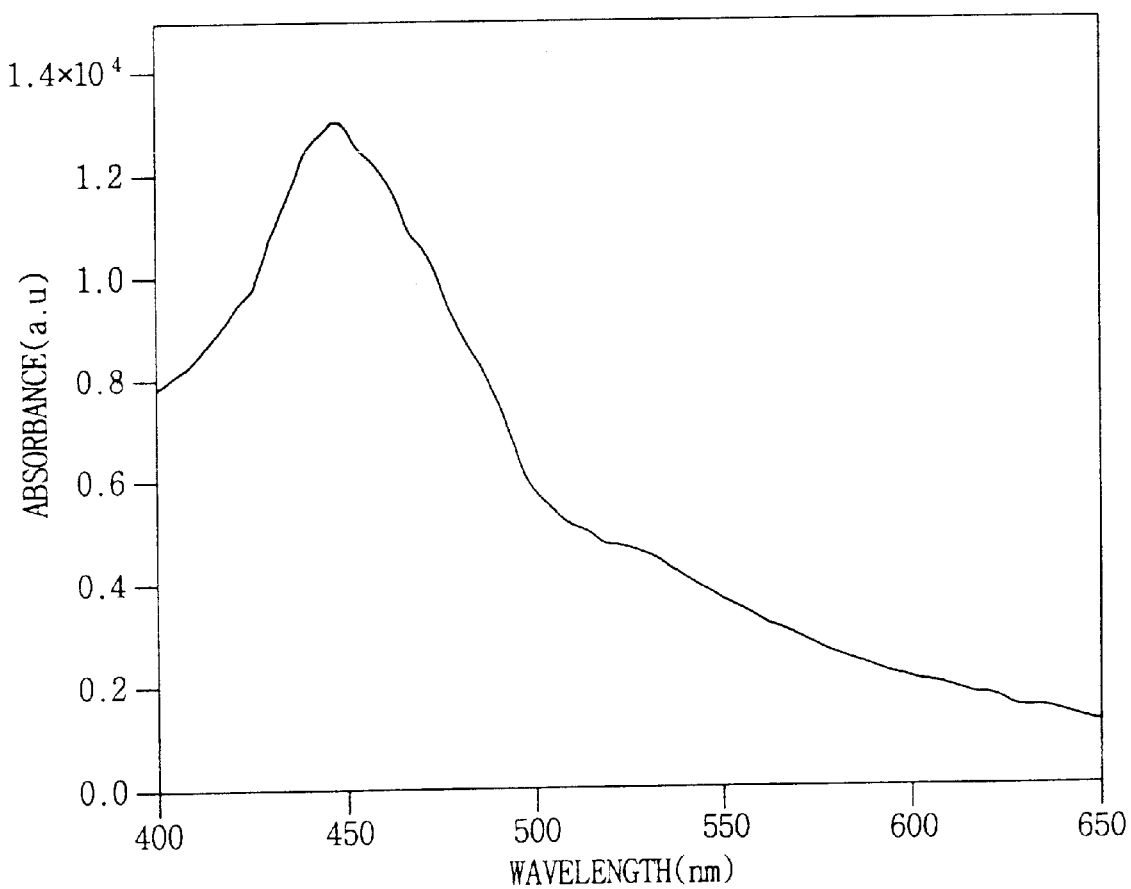
FIG. 16 is a diagram illustrating the EL spectrum of a polymer (polyvinylcarbazole/C-2=8/2) according to Example 17 of the present invention.

Meanwhile, EL characteristics were measured using an EL device which has a most typical structure, namely, an ITO/luminescent layer/electrode structure. In this case, the luminescent layer may be made of the polymers manufactured according to the Examples, or that obtained by blending macromolecules for general use, as described in association with the present invention, for example, polyvinylcarbazole, polymethylmethacrylate, polystyrene, and epoxy resin, etc., with the polymers of the present invention, in the presence of a chloroform solvent. For the material for the electrodes, aluminum was selected. The EL device was fabricated by depositing aluminum on a luminescent layer, spin-coated to 100 nanometers on an ITO glass substrate, in accordance with a vacuum deposition method, as in the sample manufacturing method used to prepare samples for the measurement of UV or PL spectrum. In FIG. 16, there is shown the result of measured EL spectrum for a blend of the copolymer of Example 17 with polyvinylcarbazole.

The present invention provides a synthesized alternative polymer having diacetylene and fluorene. This polymer is useful as photoluminescence macromolecules because it has a high molecular weight, thereby exhibiting excellent physical properties, while exhibiting a high bluish green light emitting efficiency. Thus, photoluminescence diodes fabricated using the polymer of the present invention as a photoluminescence material show a high optical efficiency.

What is claimed is:

1. A diacetylene-based polymer of the following formula (I):

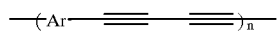

wherein, Ar represents the light emitting group expressed by at least one of the following formulas:

Ar =

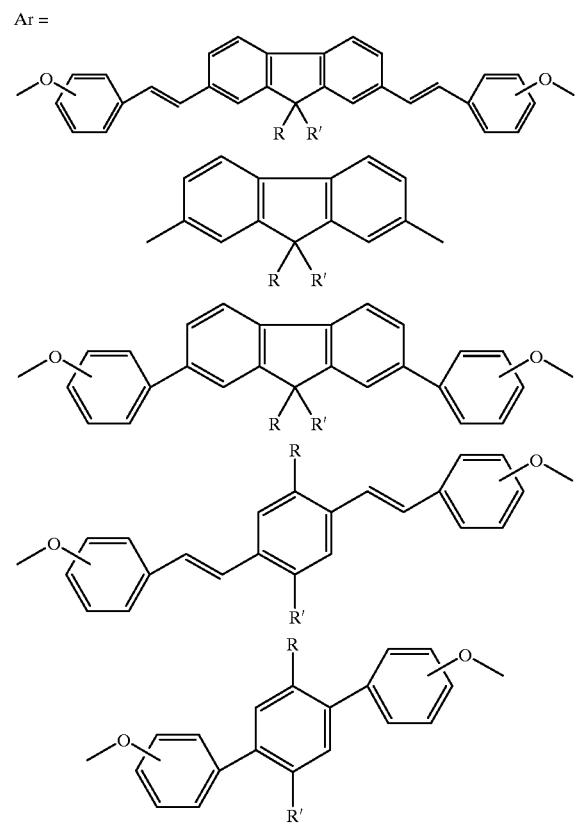

-continued

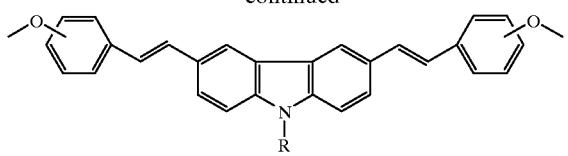

wherein R and R' are identical or different, and represent hydrogen, aliphatic or alicyclic alkyl or alkoxy groups containing 1 to 22 carbon atoms, aryl or aryloxy group containing 6 to 18 carbon atoms, or alkyl or aryl derivatives of silicon, tin or germanium; and n is an integer equal to or greater than 1.

2. The diacetylene-based polymer according to claim 1, wherein R and R' is each independently hydrogen, methyl, ethyl, propyl, isopropyl, butyl, isobutyl, pentyl, hexyl, ethylhexyl, heptyl, octyl, isooctyl, nonyl, decyl, dodecyl, hexadecyl, octadecyl, docodecyl, cyclopropyl, cyclopentyl, cyclohexyl, methoxy, ethoxy, butoxy, hexyloxy, methoxyethoxyethyl, methoxyethoxyethoxyethyl, phenyl, phenoxy, tolyl, benzyl, naphthyl, anthracene, trimethylsilyl, triphenylsilyl, tributyltin, or triethylgermanium group, and n is an integer of 1 to 2,000.

3. The diacetylene-based polymer according to claim 1, wherein R and R' is each independently an n-hexyl group, and n is an integer of 1 to 1,000.

4. A copolymer containing two or more of different diacetylene polymers of claim 1 as repeating units.

5. A copolymer of the diacetylene polymer of claim 1 with at least one selected from the group consisting of the following acetylene-based compounds:

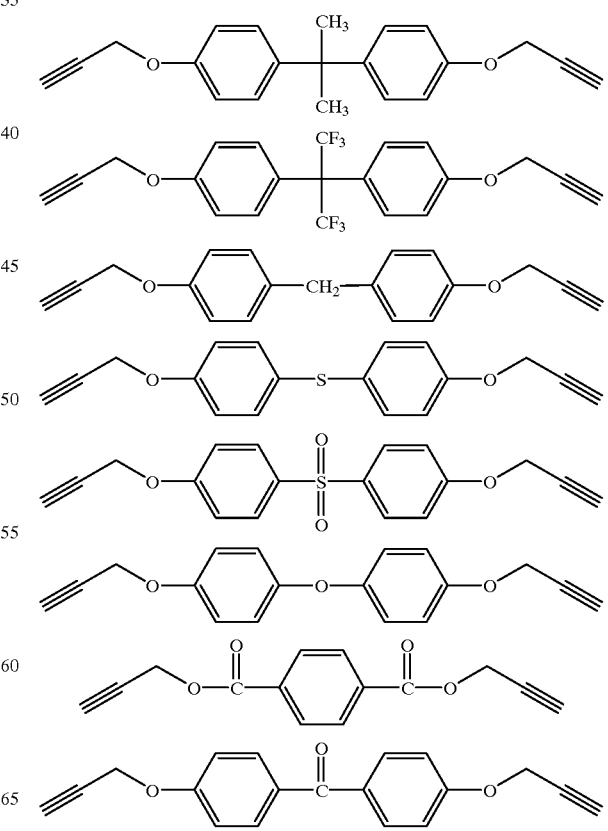

-continued

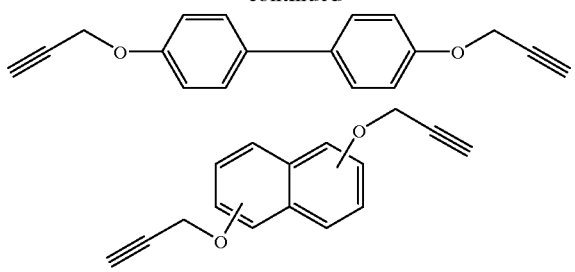

6. An electroluminescence device having a structure of cathode/luminescent layer/anode or cathode/hole transfer layer/luminescent layer/anode, wherein the luminescent layer is made of the diacetylene-based polymer of claim 1.

7. The electroluminescence device according to claim 6, wherein the luminescent layer is cross-linked by heat and/or irradiation.

8. The electroluminescence device according to claim 6, wherein the luminescent layer is made of a blend of the diacetylene-based polymer of claim 1 with at least one macromolecule for general use.

9. The electroluminescence device according to claim 8, wherein the macromolecule for general use is selected from the group consisting of polyvinylcarbazole, polymethylmethacrylate, polyacrylate, polystyrene, polycarbonate, polyvinylchloride, polyethylene, polypropylene, polyacrylonitrile, polyvinylpyrrolidone, polyvinylalcohol, polyvinylacetate, polyvinylbutyral, polyvinylamine, polycaprolactone, polyethyleneterephthalate, polybutyleneterephthalate, polyurethane, acrylonitrilestyrenebutadiene (ABS), polysulfone, polyvinylfluoride, acetal, polyamide, polyimide, polyester, alkyd, urea, furan, nylon, melamine, phenol, silicone, and epoxy.

10. The electroluminescence device according to claim 8, wherein the diacetylene-based polymer is present in an amount of 0.1 to .99% by weight, based on the weight of the macromolecule.

11. The electroluminescence device according to claim 9, wherein the diacetylene-based polymer is present in an amount of 0.1 to 99% by weight, based on the weight of the macromolecule.

* * * * *